(12) United States Patent
Brink et al.

(10) Patent No.: US 10,305,015 B1
(45) Date of Patent: May 28, 2019

(54) LOW LOSS ARCHITECTURE FOR SUPERCONDUCTING QUBIT CIRCUITS

(71) Applicant: INTERNATIONAL BUSINESS MACHINES CORPORATION, Armonk, NY (US)

(72) Inventors: Markus Brink, White Plains, NY (US); Antonio Corcoles-Gonzalez, Mount Kisco, NY (US); Jay M. Gambetta, Yorktown Heights, NY (US); Sami Rosenblatt, White Plains, NY (US); Firat Solgun, Ossining, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/827,718

(22) Filed: Nov. 30, 2017

(51) Int. Cl.

| H01L 39/22 | (2006.01) |
| G06N 99/00 | (2019.01) |
| H01L 39/24 | (2006.01) |
| H01P 3/08 | (2006.01) |
| H01L 25/065 | (2006.01) |

(52) U.S. Cl.
CPC ......... H01L 39/223 (2013.01); G06N 99/002 (2013.01); H01L 25/0657 (2013.01); H01L 39/2403 (2013.01); H01L 39/2406 (2013.01); H01L 39/2416 (2013.01); H01P 3/082 (2013.01)

(58) Field of Classification Search
CPC ... G06N 99/002; H01L 39/223; H01L 39/025; H01L 39/2493; H01L 21/00; H01L 39/045; H01L 2224/73207; H01L 225/06513; H01L 23/49888; H01L 24/16; H01L 25/50; H01L 27/18; H01L 39/14; B82Y 10/00; B82Y 15/00; H03K 17/92; H03K 19/195; H03K 3/38; H01P 1/20381; H01P 7/082; H01P 7/00; H01P 7/08; H03H 7/0115; H01F 41/048; G11C 11/44; H03D 7/005; Y10S 977/933
See application file for complete search history.

(56) References Cited

U.S. PATENT DOCUMENTS 6,930,320 B2   8/2005  Blais et al.
8,159,313 B2 * 4/2012  Uchaykin ............. H01P 1/2039
                                                        333/166
(Continued)

FOREIGN PATENT DOCUMENTS

WO   2016073082 A1   5/2016
WO   2016138395 A1   9/2016
(Continued)

OTHER PUBLICATIONS

Markus Brink et al., "Bumped Resonator Structure". Related U.S. Appl. No. 15/827,729, filed Nov. 30, 2017.
(Continued)

*Primary Examiner* — Vibol Tan
(74) *Attorney, Agent, or Firm* — Cantor Colburn LLP; Grant Johnson

(57) ABSTRACT

A technique relates to a structure. A first surface includes an inductive element of a resonator. A second surface includes a first portion of a capacitive element of the resonator and at least one qubit. A second portion of the capacitive element of the resonator is on the first surface.

23 Claims, 28 Drawing Sheets

(56) References Cited

U.S. PATENT DOCUMENTS

| | | | |
|---|---|---|---|
| 9,152,924 B2 | 10/2015 | Bonderson et al. | |
| 9,455,392 B2 | 9/2016 | Abraham et al. | |
| 9,501,748 B2* | 11/2016 | Naaman | G06N 99/002 |
| 9,762,200 B2* | 9/2017 | Thom | H03H 1/00 |
| 9,806,711 B1* | 10/2017 | Abdo | H03K 17/92 |
| 9,836,699 B1* | 12/2017 | Rigetti | G06N 99/002 |
| 9,847,121 B2* | 12/2017 | Frank | G06N 99/002 |
| 9,857,509 B2* | 1/2018 | Abdo | G02B 5/208 |
| 9,857,609 B2* | 1/2018 | Bishop | G02F 1/011 |
| 9,870,536 B1* | 1/2018 | Abdo | G06N 99/002 |
| 9,885,888 B2* | 2/2018 | Bishop | G02F 1/011 |
| 9,922,289 B2* | 3/2018 | Abdo | G06N 99/002 |
| 9,927,636 B2* | 3/2018 | Bishop | G02F 1/011 |
| 9,941,459 B2* | 4/2018 | Abdo | H01L 39/025 |
| 9,947,856 B2* | 4/2018 | Abdo | H01L 39/223 |
| 10,134,972 B2* | 11/2018 | Oliver | H01L 25/0657 |
| 2013/0029848 A1 | 1/2013 | Gonzalez et al. | |
| 2016/0104073 A1 | 4/2016 | Sandberg et al. | |
| 2017/0062898 A1 | 3/2017 | Chang et al. | |
| 2017/0133336 A1* | 5/2017 | Oliver | H01L 24/05 |
| 2017/0213143 A1 | 7/2017 | Chow et al. | |
| 2018/0012932 A1* | 1/2018 | Oliver | H01L 24/05 |
| 2018/0013052 A1* | 1/2018 | Oliver | H01L 25/0657 |
| 2018/0054201 A1* | 2/2018 | Reagor | G06N 99/002 |

FOREIGN PATENT DOCUMENTS

| | | |
|---|---|---|
| WO | 2017021714 A1 | 2/2017 |
| WO | 2017055942 A1 | 4/2017 |
| WO | 2017105429 A1 | 6/2017 |
| WO | 2017105524 A1 | 6/2017 |
| WO | 2017115160 A1 | 7/2017 |

OTHER PUBLICATIONS

List of IBM Patents or Patent Applications Treated as Related; (Appendix P), Filed Mar. 2, 2018; pp. 1-2.

International Search Report and Written Opinion; International Application No. PCT/IB2017/058214; International Filing Date—Dec. 20, 2017; dated Aug. 22, 2018; 9 pages.

* cited by examiner

2700

DISPOSE INDUCTIVE ELEMENTS OF RESONATORS AND FIRST PORTIONS OF CAPACITIVE ELEMENTS OF THE RESONATORS ON A FIRST SURFACE 2702

DISPOSE AT LEAST TWO QUBITS COUPLED BY A BUS RESONATOR ON A SECOND SURFACE, THE SECOND SURFACE COMPRISING SECOND PORTIONS OF THE CAPACITIVE ELEMENTS OF THE RESONATORS 2704

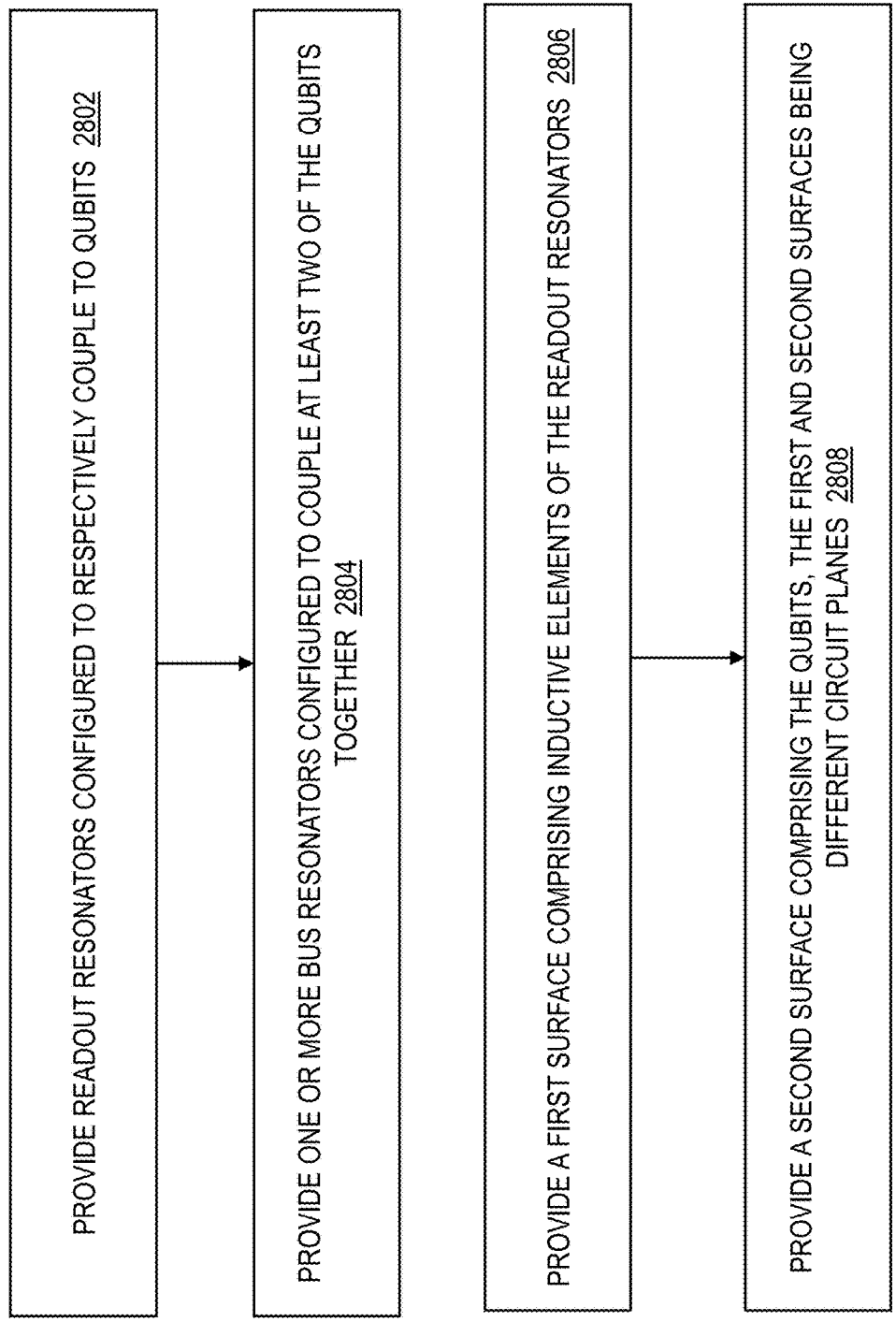

LOW LOSS ARCHITECTURE FOR SUPERCONDUCTING QUBIT CIRCUITS

BACKGROUND

The present invention generally relates to superconducting structures, and more specifically, to low loss architectures for superconducting qubit circuits.

Superconducting quantum computing is an implementation of a quantum computer in superconducting electronic circuits. Quantum computation studies the application of quantum phenomena for information processing and communication. The basic building block of such a quantum computer is the quantum bit or qubit. As a generalization, a qubit is similar to the classical bit in that it is a system of two discrete states, which can be in the discrete quantum states $|1\rangle$ and $|2\rangle$, as well as arbitrary superposition states. These discrete quantum states can be any set of two quantum mechanical levels, such as an electron spin or nuclear spin, or a pair of energy levels in an atom, ion or molecule. Similar to universal logic operations, there also exists a set of quantum gates which are universal, such that combinations of gates can realize complex quantum algorithms. A quantum gate is a generalization of a logic gate. However, the quantum gate describes the transformation that one or more qubits will experience after the gate is applied on them, given their initial state.

The electromagnetic energy associated with the qubit can be stored in so-called Josephson junctions and in the capacitive and inductive elements that are used to form the qubit. In one example, to read out the qubit state, a microwave signal is applied to the microwave readout cavity that couples to the qubit at the cavity frequency. The transmitted (or reflected) microwave signal goes through multiple thermal isolation stages and low-noise amplifiers that are required to block or reduce the noise and improve the signal-to-noise ratio. The microwave signal is measured at room temperature. The amplitude and/or phase of the returned/output microwave signal carry information about the qubit state, such as whether the qubit is at a ground state, an excited state, or a superposition of the two states.

SUMMARY

Embodiments of the present invention are directed to a structure. A non-limiting example of the structure includes a first surface having an inductive element of a resonator. The structure includes a second surface having a first portion of a capacitive element of the resonator and at least one qubit, where a second portion of the capacitive element of the resonator is on the first surface.

Embodiments of the present invention are directed to a method of forming a structure. A non-limiting example of the method of forming the structure includes disposing an inductive element of a resonator on a first surface and disposing a first portion of a capacitive element of the resonator and at least one qubit on a second surface, where a second portion of the capacitive element of the resonator is on the first surface.

Embodiments of the present invention are directed to a structure. A non-limiting example of the structure includes a first surface having inductive elements of resonators and first portions of capacitive elements of the resonators. The structure includes a second surface having at least two qubits coupled by a bus resonator. The second surface includes second portions of the capacitive elements of the resonators.

Embodiments of the present invention are directed to a method of forming a structure. A non-limiting example of the method of forming the structure includes disposing inductive elements of resonators and first portions of capacitive elements of the resonators on a first surface. The method includes disposing at least two qubits coupled by a bus resonator on a second surface. The second surface includes second portions of the capacitive elements of the resonators.

Embodiments of the present invention are directed to a superconducting qubit circuit. A non-limiting example of superconducting qubit circuit includes readout resonators configured to respectively couple to qubits, one or more bus resonators configured to couple at least two of the qubits together, a first surface comprising inductive elements of the readout resonators, and a second surface having the qubits. The first and second surfaces are different circuit planes.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 28 depicts a flow chart of forming a superconducting qubit circuit according to embodiments of the invention.

Figure 1:
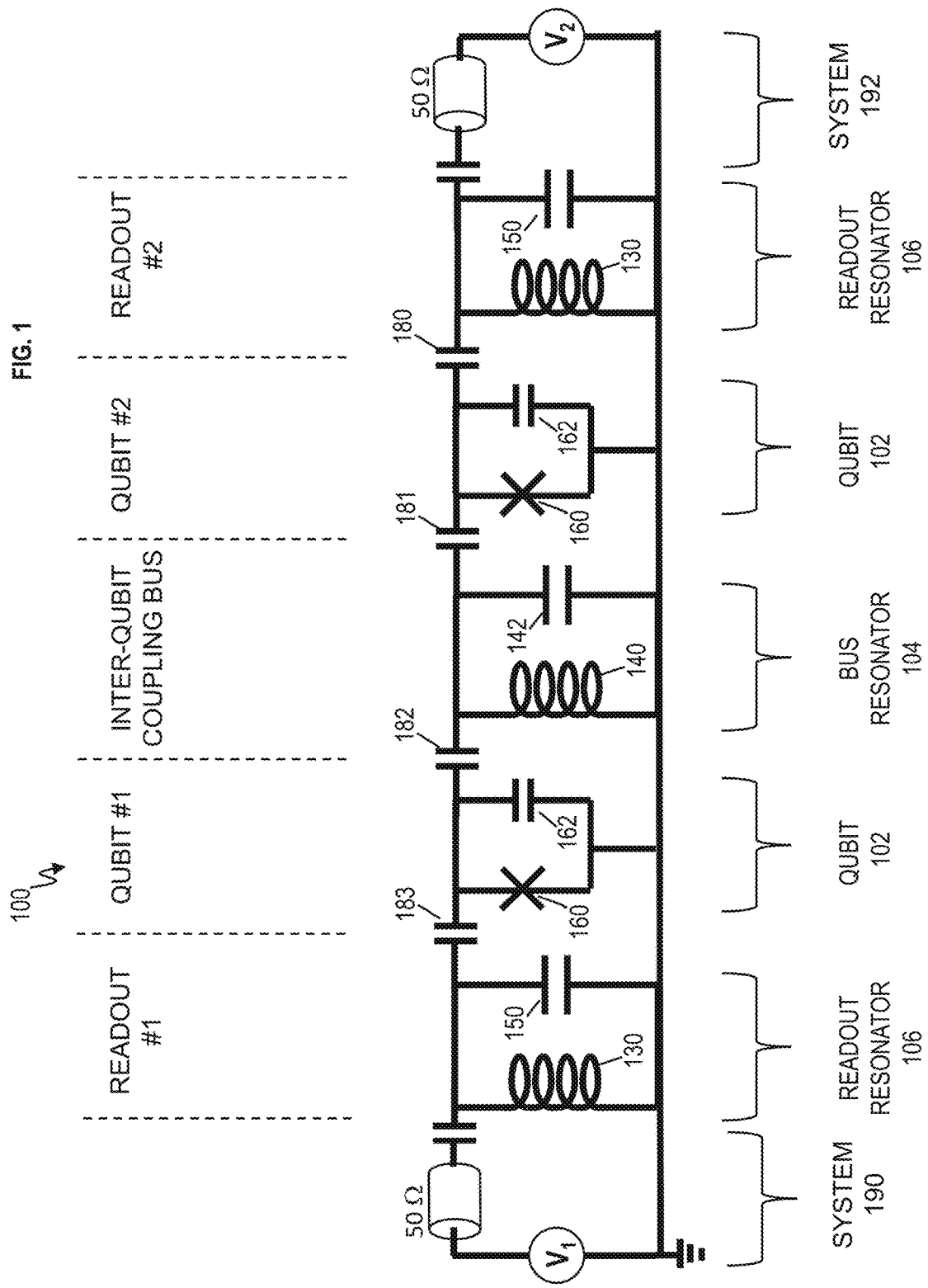
FIG. 1 depicts a schematic circuit diagram of two coupled qubits with individual readout according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor and/or superconducting devices and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor and/or superconducting devices and semiconductor/superconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, techniques to "break the plane" are needed for scaling up superconducting quantum computing hardware for larger qubit processors in an extensible way, such as, for example, 17 qubits in a distance-three surface code layout or larger. State-of-the-art researchers are developing flip chip technology and/or through-silicon-vias (TSVs) using superconducting materials to accomplish this goal. This results in the introduction of lossy materials and/or connections which might couple to the qubits and limit qubit coherence times if the electromagnetic field distributions at the transition/connection regions are not well controlled/designed. Typical uses of bumps and/or through-silicon-vias to connect different circuits within a superconducting qubit chip include either flux controls or signal delivery. As transmon qubits, a popular superconducting qubit, are electromagnetic circuits, there are a number of factors in their environment which can degrade their performance, such as fluctuators coupled to the qubit and losses in the materials and/or connections. Qubit errors can be classified as either relaxation and dephasing.

Turning now to an overview of the aspects of the invention, one or more embodiments of the invention address the above-described shortcomings of the prior art by providing a novel resonator structure. More specifically, the above-described aspects of the invention address the shortcomings of the prior art by providing a compact (lumped element) resonator structure spanning two superconducting circuit planes, and the compact resonator structure maintains most of the capacitive energy stored on one plane and most of the inductive energy stored on the other plane. In the context of qubit circuits, this compact resonator structure allows for keeping electrical currents off the qubit plane and on the readout path.

The implementation of a flip chip requires fabrication steps that go beyond what is necessary to fabricate superconducting quantum bits (qubits). Each new fabrication step can introduce new loss pathways, which may be detrimental to quantum coherence and/or qubit operation. In broad terms, keeping lossy components on the readout paths, which behave more classically, is more desirable than introducing lossy components near qubits or lossy components in the interconnects between qubits, which are needed to behave more quantum-mechanically. A small footprint of required resonant structures in the quantum circuit benefits scaling as discussed herein. Electromagnetic fields at the transition/connection regions of the compact resonator are well controlled/designed to avoid coupling of the qubits to lossy parts of the system because the lumped element resonator has magnetic fields focused in the well-defined regions of the chip, according to embodiments of the invention.

Turning now to a more detailed description of embodiments of the invention, FIG. 1 depicts a schematic circuit diagram 100 of two coupled qubits with individual readout according to embodiments of the invention. The circuit diagram is a quantum/qubit circuit as understood by one skilled in the art. The circuit diagram 100 illustrates two qubits 102 coupled by a bus resonator 104. The two qubits 102 are each coupled to its own readout resonator 106. There are four coupling capacitors 180, 181, 182, and 183. In this example from the left side, qubit 102 (e.g., also referred to as qubit #1) is coupled to the bus resonator 104 (e.g., also referred to as inter-qubit coupling bus) via coupling capacitor 182 and is coupled to readout resonator 106 (e.g., also referred to as readout resonator #1) via coupling capacitor 183. Similarly, from the right side, qubit 102 (e.g., also referred to as qubit #2) is coupled to the bus resonator 104 (e.g., inter-qubit coupling bus) via coupling capacitor 181 and is coupled to readout resonator 106 (e.g., also referred to as readout resonator #2) via coupling capacitor 180. Each qubit 102 is formed of a Josephson junction 160 and a capacitor 162. Each readout resonator 106 is formed of an inductor 130 and a capacitor 150 as understood by one skilled in the art. The bus resonator 104 is formed of an inductor 140 and capacitor 142 as understood by one skilled in the art.

For explanation purposes and not limitation, FIG. 1 illustrates one example of a superconducting qubit circuit. Embodiments of the invention can be utilized in any type of superconducting qubit circuit as understood by one skilled in the art and are not meant to be limited to the exact elements or the exact configuration of elements in FIG. 1. Although two qubits 102 are shown coupled by one bus resonator 104 and each qubit 102 is coupled to its own readout resonator 106, it should be appreciated that multiple qubits 102 (with their respective readout resonators 106) can be coupled using multiple bus resonators 104 in various configurations. Embodiments of the invention are not meant to be limited to a specific number of qubits 102, bus resonators 104, and readout resonators 106.

As understood by one skilled in the art, a qubit system is typically connected to a 50 ohm (Ω) environment. For completeness and not limitation, FIG. 1 shows system 190 and system 192, each representative of connecting to a 50Ω environment. The system 190 represents a 50Ω resistor and voltage source ($V_1$), and the voltage source $V_1$ can be utilized to generate a qubit drive signal at the resonance frequency of qubit 102 (e.g., qubit #1) and generate a readout signal at the resonance frequency of the readout resonator 106 (e.g., readout resonator #1). Similarly, the system 192 represents a 50Ω resistor and voltage source ($V_2$), and the voltage source $V_2$ can be utilized to generate a qubit drive signal at the resonance frequency of qubit 102 (e.g., qubit #2) and generate a readout signal at the resonance frequency of the readout resonator 106 (e.g., readout resonator #2).

In accordance with embodiments of the invention, the readout resonator 106, along with any resonator such as the bus resonator 104, can be implemented as a compact (lumped element) resonator structure as discussed further herein. The compact resonator structure can also be referred to as a bumped resonator structure.

Figure 2:
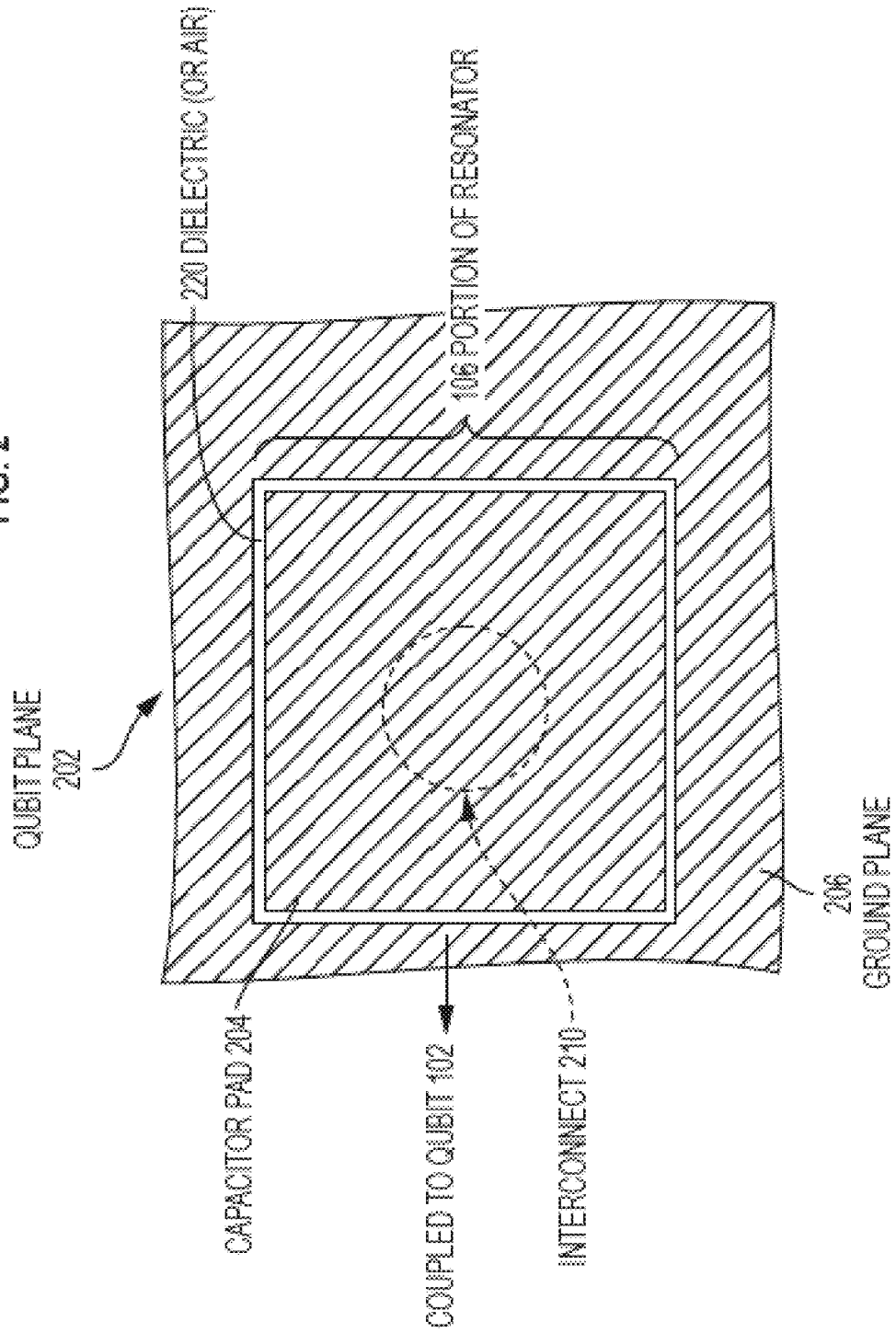
FIG. 2 depicts a top view of a portion of a qubit plane according to embodiments of the invention.

FIG. 2 depicts a top view of a portion of a qubit plane 202 according to embodiments of the invention. In FIG. 2, the qubit plane 202 illustrates a part of the readout resonator 106 in the circuit 100.

The qubit plane 202 includes a capacitor pad 204 in direct contact with an interconnect 210. The interconnect 210 is shown as dashed lines because interconnect 210 is underneath the capacitor pad 204. The interconnect 210 can be a solder connection such a solder bump and/or a through-silicon-via. The capacitor pad 204 is depicted in a square like shape in this illustration. It should be appreciated that the capacitor pad 204 can be other shapes such as rectangular, circular, polygonal, triangular, etc. The capacitor pad 204 is surrounded by a dielectric material 220. The dielectric material 220 can be a non-electrically conductive, such as an insulator. The dielectric material 220 can be air such as, for example, as an empty space or vacuum. A ground plane 206 surrounds the dielectric material 220 so as to separate the capacitor pad 204, circumscribed within the dielectric material 220, from the ground plane 206 outside of the dielectric material 220. The ground plane 206 can be on one, two, three, and/or all sides of the capacitor pad 204. The qubit 102 is formed on the qubit plane 202 but is not illustrated in FIG. 2 for the sake of conciseness. On the qubit plane 202, a portion of the compact lumped element resonator 106 (i.e., readout resonator) is the capacitor pad 204. The one end of the interconnect 210 is physically and electrically attached to the capacitor pad 204 such that the interconnect 210 and the capacitor pad 204 are equipotential, i.e., at the same electric potential or same voltage with respect to ground or with respect to a voltage source (such as $V_1$ or $V_2$), especially at the cryogenic temperatures at which the resonator 106 is used, because the materials of the interconnect 210 and the capacitor pad 204 are superconducting at such temperatures. Furthermore, the capacitor pad 204, the interconnect 210, and a capacitor pad 304 (depicted in FIG. 3) have an equipotential, i.e., the same electric potential or same voltage with respect to ground or with respect to a voltage source (such as $V_1$ or $V_2$), especially at the cryogenic temperatures at which the resonator is used, because the materials of the interconnect 210, the capacitor pad 204 and the capacitor pad 304 are superconducting at such temperatures. In some implementations, at least a portion of the capacitor pad 204, at least a portion of the interconnect 210, and at least a portion of the capacitor pad 304 (depicted in FIG. 3) have an equipotential.

Figure 3:
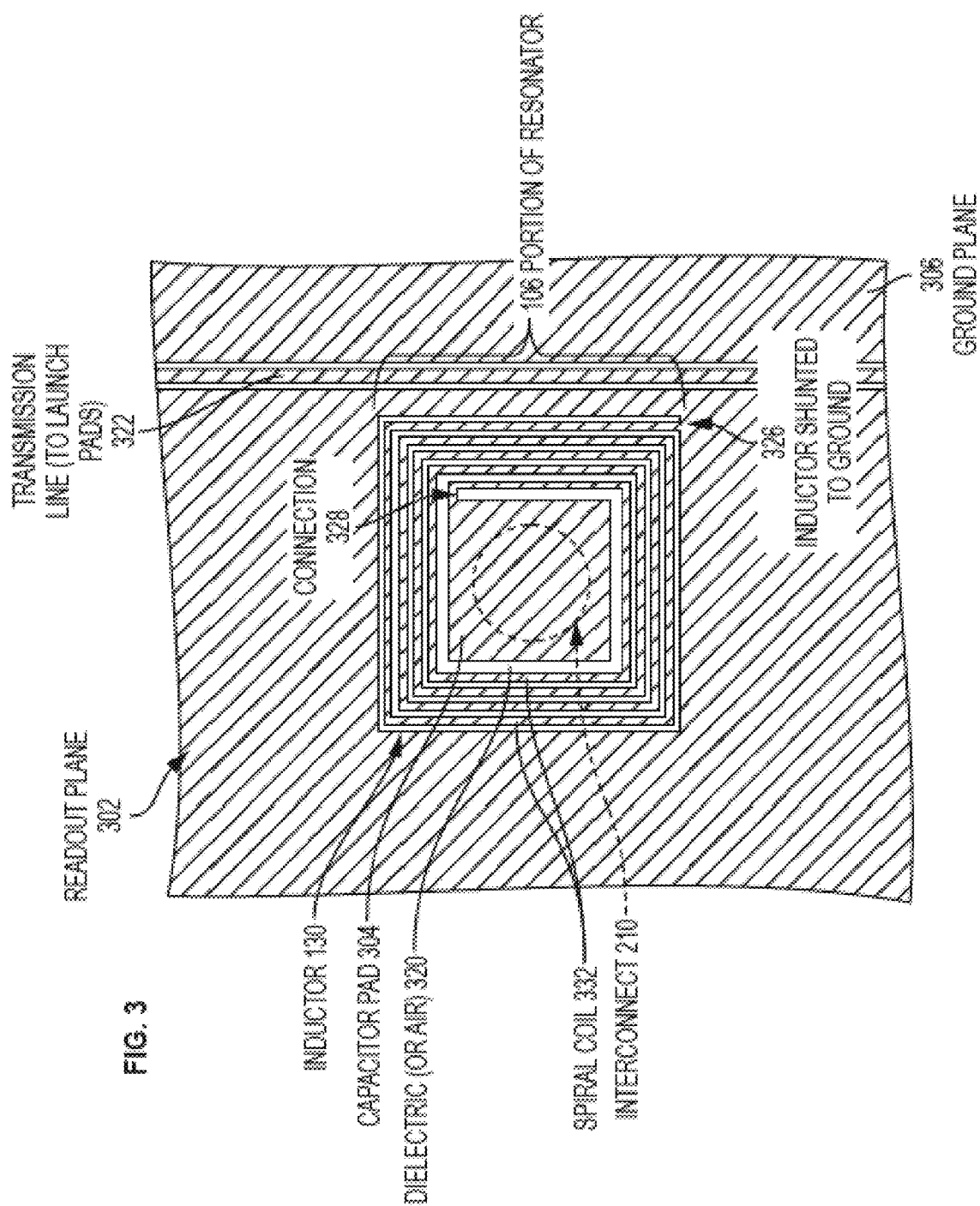
FIG. 3 depicts a top view of a portion of a readout plane according to embodiments of the invention.

FIG. 3 depicts a top view of a portion of a readout plane 302 according to embodiments of the invention. In FIG. 3, the readout plane 302 illustrates another part of the readout resonator 106 in the circuit 100.

The readout plane 302 can also be referred to as the control plane because transmission signal for driving the qubit 102 (each qubit can have its own resonance frequency) and reading out the readout resonator 106 (each readout resonator can have its own resonance frequency) can enter and exit the readout plane 302. The readout plane 302 includes a capacitor pad 304 in direct contact with the interconnect 210. The capacitor pad 304 and capacitor pad 204 are attached to opposite ends/portions of the interconnect 210. As noted above, the interconnect 210 is shown as dashed lines because interconnect 210 is underneath the capacitor pad 304. It is noted that whether the interconnect 210 is underneath (or above) the capacitor pad 204 or capacitor pad 304 is based on whether the qubit plane 202 is on top or the readout plane 302 is on top. For example, if the qubit plane 202 having the capacitor pad 204 is on top and the readout plane 302 is on the bottom, then interconnect 210 is underneath the capacitor pad 204 but above the capacitor pad 304 of the readout plane 302. Conversely, if the readout plane 302 having the capacitor pad 304 is on top and the qubit plane 202 is on the bottom, then interconnect 210 is underneath the capacitor pad 304 but above the capacitor pad 204 of the qubit plane 202. In some cases, the qubit plane 202 and readout plane 302 can be on the side (e.g., left and right sides), and not necessarily on the top and bottom.

The readout plane 302 includes the inductor 130. The inductor 130 is formed of a spiral coil 332 that meanders around the capacitor pad 304. Forming the spiral coil 332 around the capacitor pad 304 is one example. There spiral coil 332 is the inductive part of the readout resonator 106, but the readout resonator 106 is not limited to the spiral coil 332 as the inductive part and there can be other structures utilized. Another example, structure, and/or shape to form the spiral coil 332 of the inductor can include a meandering transmission line, a kinetic inductor (with high kinetic inductance material), a Josephson junction, and/or a series array of Josephson junctions, as discussed further in FIGS. 10-28.

Kinetic inductance originates in the kinetic energy required by each electron that is contributing to a flow of current. Kinetic inductance is the manifestation of the inertial mass of mobile charge carriers (e.g., electrons) in alternating electric fields as an equivalent series inductance. Kinetic inductance is observed in high carrier mobility conductors (e.g. superconductors) and at very high frequencies. The high kinetic inductor is based on the geometry of the material and being a superconductor material that has a high inductance at superconducting temperatures (e.g., cryogenic temperatures). A high kinetic inductance material for a kinetic inductor can include niobium nitride (NbN), niobium titanium nitride (NbTiN), and/or titanium nitride (TiN). Niobium nitride has a higher inductance than niobium alone. The high kinetic inductor can be formed in a line and is not required to be coiled like the spiral coil 332. As understood by one skilled in the art, a Josephson junction is also an inductive element, and one or more Josephson junctions (e.g., in series) can be utilized to replace the spiral coil 332 as the inductive element in the readout resonator 106.

In FIG. 3, one end of the spiral coil 332 is attached to the capacitor pad 304 at connection 328 and the other end of the spiral coil 332 is shunted to a ground plane 306 at connection 326. The ground plane 306 surrounds the capacitor pad 304 and the spiral coil 332. In some implementations, the ground plane 306 can be on one, two, three, and/or all sides of the capacitor pad 304. It should be appreciated that the capacitor pad 304 can be other shapes such as rectangular, circular, polygonal, triangular, etc.

A dielectric material 320 can surround the capacitor pad 304 (except at the connection 328 and is in between the wires (i.e., lines) of the spiral coil 332. The dielectric material 320 and 220 can be the same in some implementations. In other implementations, the dielectric material 320 and 220 can be different materials. As noted above, the dielectric material 320 can be a non-electrically conductive material, such as an insulator. Also, the dielectric material can be an empty space such as, for example, air or vacuum.

The spiral coil 332 of the inductor 130 is coupled (e.g., mostly inductively coupled) to a transmission line 322. In some implementations, the spiral coil 332 can be inductively coupled to the transmission line 322. For example, the transmission line 322 connects the inductor 130 to launch pads which provide external connection to readout resonator 106 (via the inductor 130) and to the qubit 102.

The readout resonator 106 has portions in both the qubit plane 202 and the readout plane 302. For example, the capacitor 150 of the readout resonator 106 is formed of the qubit plane capacitor pad 204, the interconnect 210, and the readout plane capacitor pad 304 while the inductor 130 is formed of the spiral coil 332. The capacitive portion (shown as 150 in FIG. 1) of the readout resonator 106 is on both the qubit plane 202 and the readout plane 302. By the unique structure, it should be recognized that the inductive portion shown as inductor 130 formed by the spiral coil 332 is only on the readout plane 302 and is not on the qubit plane 202. Further description of the readout resonator 106 can be understood by the cross-sectional views depicted in FIGS. 4 and 5.

Figure 4:
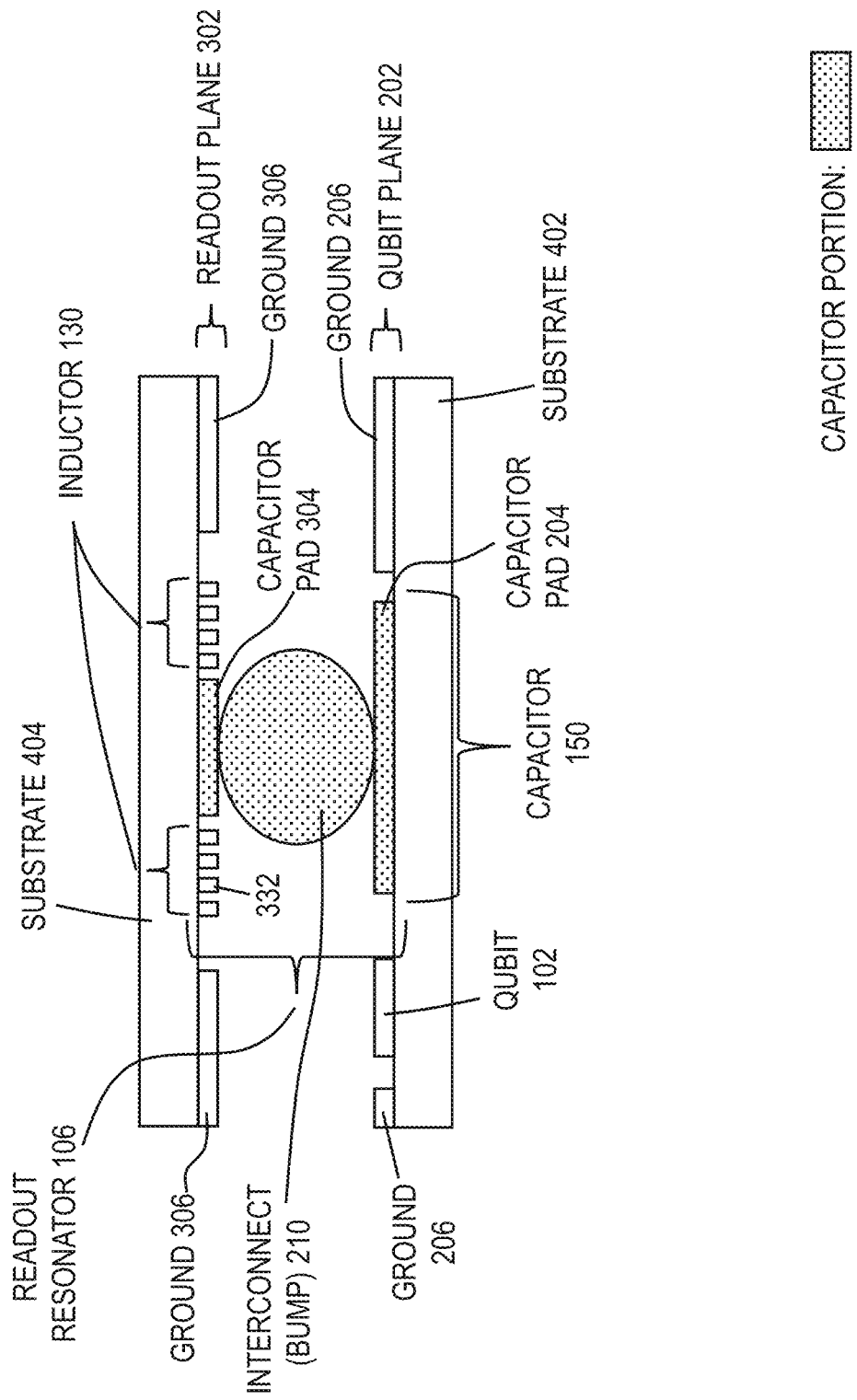
FIG. 4 depicts a cross-sectional view of a portion of the qubit plane and readout plane according to embodiments of the invention.

FIG. 4 depicts a cross-sectional view of a portion of the qubit plane and readout plane according to embodiments of the invention. FIG. 4 shows another depiction of the lumped element readout resonator 106. FIG. 4 illustrates an example in which the interconnect 210 is a solder bump that attaches to both the capacitor pad 204 and to the capacitor pad 304. The solder bump physically and electrically connects the qubit plane 202 to the readout plane 302. As can be seen in FIG. 4, the readout resonator 106 is formed of the spiral coil 332 of the inductor 130 and the capacitor pad 204, capacitor pad 304, and interconnect 210 (e.g., solder bump) of the capacitor 150. The inductor 130 made of the spiral coil 332 is only on the readout plane 302 such that the qubit plane 202 is free of the inductive elements (e.g., spiral coil 332) of the readout resonator 106. By isolating the inductor 130 on the readout plane 302 away from the qubit plane 202, the qubit 102 is isolated from magnetic fields created by the electrical current flowing through the spiral coil 332 of the inductor 130. The magnetic fields of the inductor 130 of readout resonator 106 can cause decoherence of the qubit 102. The capacitor 150 has two plates, where one plate is the capacitor pad 204 in the qubit plane 202 and the other plate is the capacitor pad 304 in the readout plane 302.

As an example implementation, FIG. 4 depicts the qubit plane 202 formed on a substrate 402 and the readout plane 302 formed on a substrate 404. The substrate 402 and 404 can be any suitable material. The substrates 402 and 404 may or may not be the same material. The substrates 402 and 404 can be silicon substrates, sapphire substrates, silicon-on-insulator substrates, and/or any combination thereof. The substrate 402 can be one wafer and the substrate 404 can be another wafer. The qubit plane 202 formed on substrate 402 can be one chip and the readout plane 302 formed on substrate 404 can be another chip. Although not shown for simplicity, the ground plane 206 of the qubit plane 202 can be electrically and physically connected to the ground plane 306 of the readout plane 302 by multiple interconnects such that the ground planes 206 and 306 are maintained at the same potential (or nearly the same potential).

It is noted that the interconnect 210, i.e., the solder bump, can be formed and deposited using flip chip technology. Although the readout plane 302 is depicted as being on top of the qubit plane 202, the selection of the top and bottom planes is arbitrary. The circuit elements in FIGS. 1-6 can be formed by lithography, electroplating, etc., and patterning accordingly as understood by one skilled in the art. More particularly, the Josephson junctions can be formed by shadow evaporation techniques, etc. In FIG. 4, the circuits of the readout plane 302 and qubit plane 202 can be separately formed. Subsequently, flip chip technology can be utilized to deposit the solder bump as the interconnect 210 on any one of the planes and the other plane can then be connected to the other plane via the solder bump. Although not shown for the sake of conciseness, under-bump metallization (UBM) can be utilized on the capacitor pad 204 and/or the capacitor pad 304 to form a good connection respectively to the solder bump as understood by one skilled in the art. As discussed further herein, the materials of the circuit elements in the qubit plane 202 and readout plane 302 are superconducting materials, along with the interconnect 210.

Figure 5:
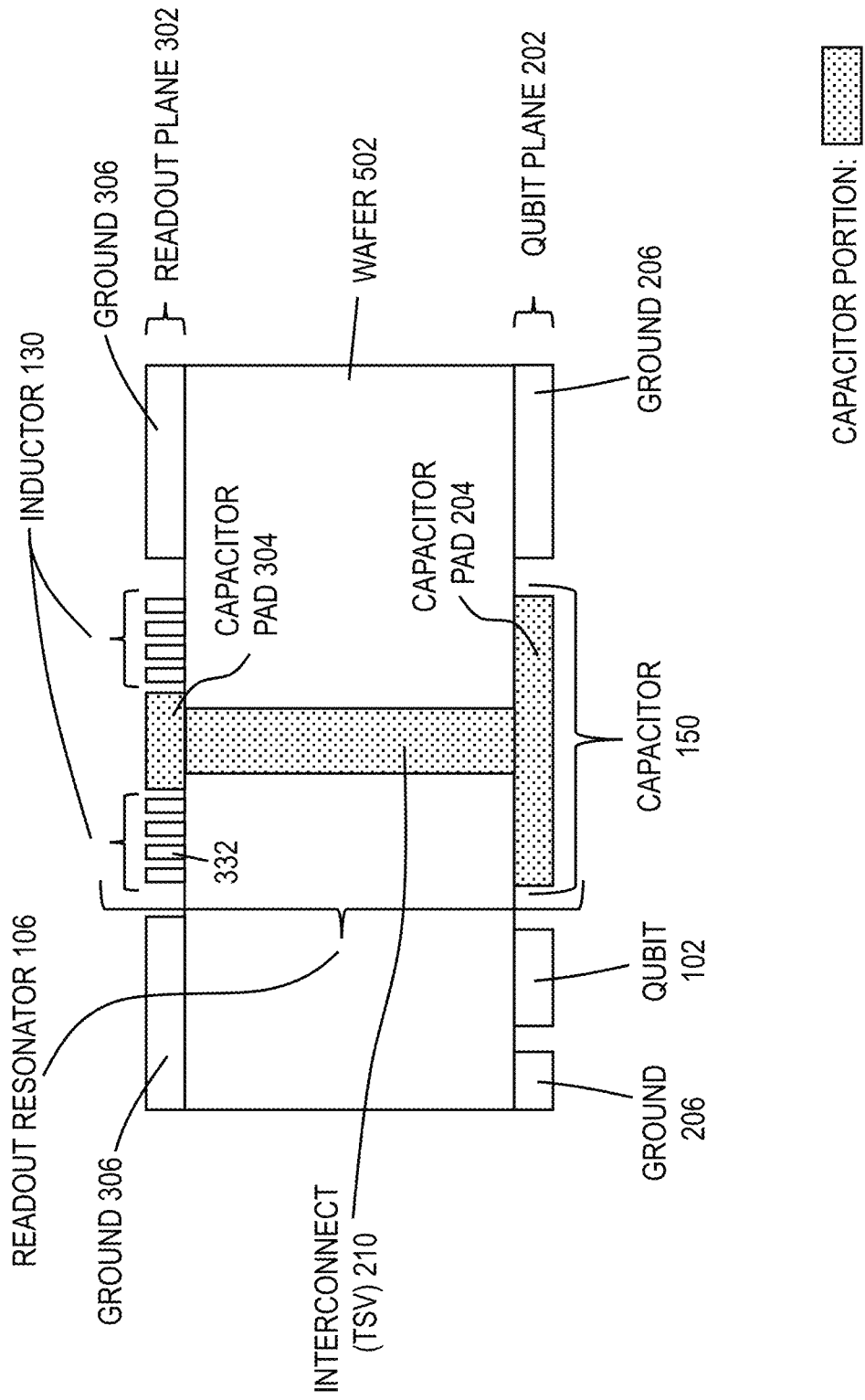
FIG. 5 depicts a cross-sectional view of a portion of the qubit plane and readout plane according to embodiments of the invention.

FIG. 5 depicts a cross-sectional view of a portion of the qubit plane and readout plane according to embodiments of the invention. FIG. 5 shows another depiction of the lumped element readout resonator 106. Particularly, FIG. 5 illustrates an example in which the interconnect 210 is a through-silicon-via that attaches to both the capacitor pad 204 and to the capacitor pad 304. The through-silicon-via physically and electrically connects the qubit plane 202 to the readout plane 302. Unlike the solder bump interconnect, the through-silicon-via is formed through wafer 502 to thereby connect the qubit and readout planes 202 and 302. Instead of the qubit plane 202 facing the readout plane 302 in FIG. 4, the qubit and readout planes 202 and 302 are formed on opposite sides/surfaces of the wafer 502. In some implementations, there can be one or more layers of materials between the qubit plane 202 and the wafer 502 and/or there can be one or more layers of materials between readout plane 302 and the wafer 502. The wafer 502 can include the same materials discussed above for substrates 402 and/or 404. Although not shown for simplicity, the ground plane 206 of the qubit plane 202 can be electrically and physically connected to the ground plane 306 of the readout plane 302 by multiple interconnects such that the ground planes 206 and 306 are maintained at the same potential (or nearly the same potential).

As discussed above, the inductor 130 made of the spiral coil 332 is only on the readout plane 302 such that the qubit plane 202 is free of the inductive elements (e.g., spiral coil 332) of the readout resonator 106. The capacitor 150 has two plates, where one plate is the capacitor pad 204 in the qubit plane 202 and the other plate is the capacitor pad 304 in the readout plane 302. As can be seen in FIG. 5, the readout resonator 106 is formed of the spiral coil 332 of the inductor 130 and the capacitor pad 204, capacitor pad 304, and interconnect 210 (e.g., TSV) of the capacitor 150. In FIG. 5, the circuit of the qubit plane 202 can be formed on one surface of the wafer 502, the through-silicon-via is formed to connect with the capacitor pad 204 of the qubit plane 202, and the circuit of the readout plane 302 is formed on the opposite surface of the wafer 502 such that the capacitor pad 304 is in direct connect with the through-silicon-via (i.e., interconnect 210).

Figure 6:
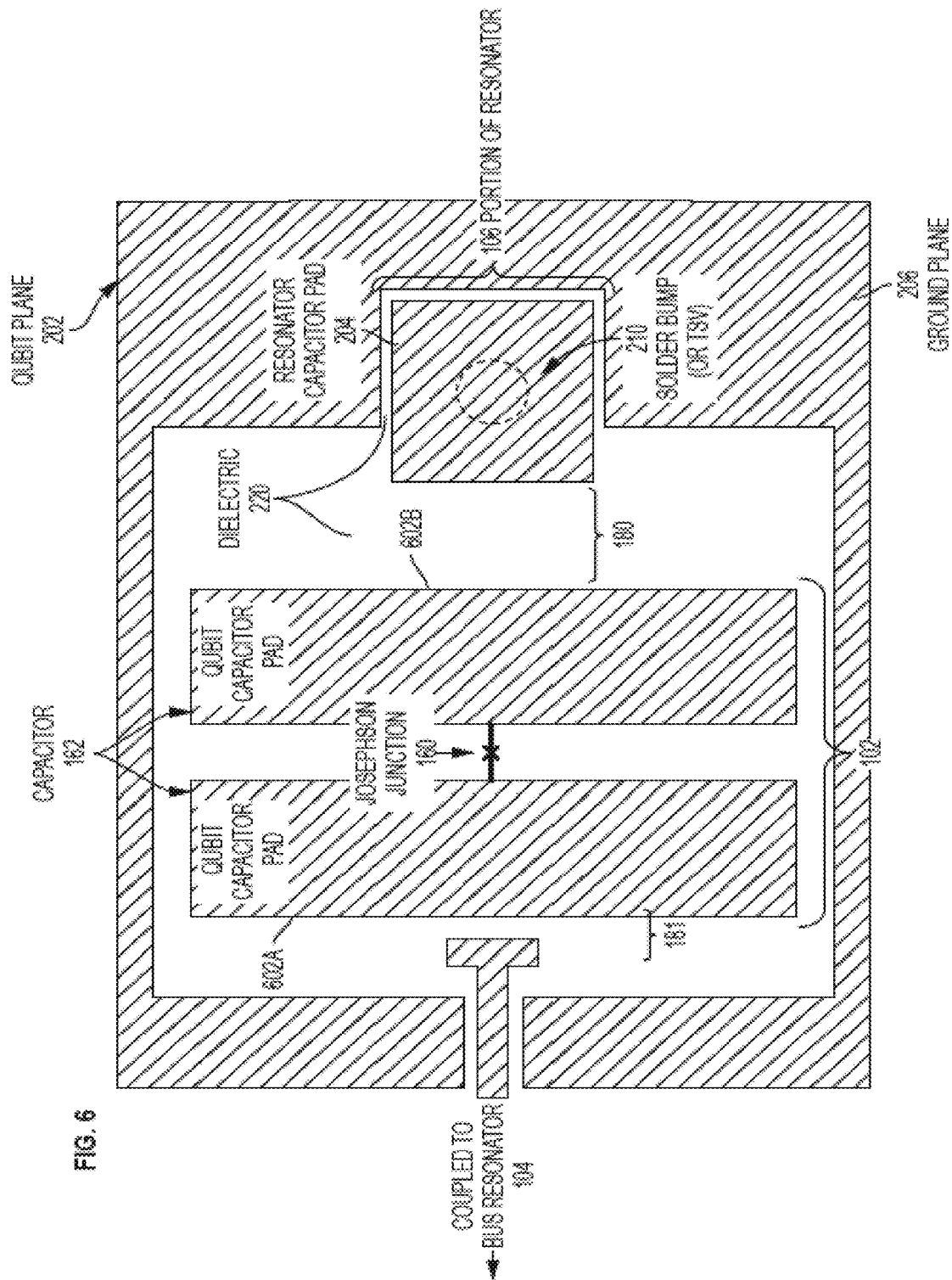
FIG. 6 depicts an example layout of a qubit coupling to a readout resonator and a bus resonator according to embodiments of the invention.

FIG. 6 depicts an example layout of a qubit coupling to a readout resonator and a bus resonator according to embodiments of the invention. Above, FIG. 2 illustrates a portion of the qubit plane 202 that focuses on a portion of the readout resonator 106. FIG. 6 illustrates an example showing the qubit 102 capacitively coupled via coupling capacitor 180 to the capacitor pad 204 of the readout resonator 106. The qubit 102 shows the capacitor 162 formed of qubit capacitor pads 602A and 602B separated by the dielectric material 220 (which may be air or vacuum). The qubit 102 includes the Josephson junction 160 connected to the qubit capacitor pads 602A and 602B. The capacitor pads 602A and 602B are superconducting material. The Josephson junction 160 includes two superconducting materials separated by any of the following: a dielectric material, a short length of normal (non-superconducting) metal, or a constriction of a superconductor. The qubit 102 is capacitively coupled to the bus resonator 104 via coupling capacitor 181. In this example, the bus resonator 104 is not shown. In some embodiments of the invention, the bus resonator 104 can be formed in the same manner discussed for the readout resonator 106, such that the bus resonator 104 is a compact lumped element resonator (using a solder bump and/or through-silicon-via interconnect 210). In some embodiments of the invention, the bus resonator 104 can be formed using state-of-the-art techniques as understood by one skilled in the art, and the bus resonator 104 is not shown in FIG. 6 so as not to obscure the figure.

Technical benefits and advantages include a compact (lumped element) resonator structure (e.g., readout resonator 106) spanning two superconducting circuit planes, and the compact resonator structure maintains most of the capacitive energy stored on the qubit plane 202 and most of the inductive energy stored on the readout plane 302. This compact resonator structure keeps electrical currents off the qubit plane 202 containing the qubit 102 and on the readout path on the readout plane 302. Electromagnetic fields at the transition/connection regions (e.g., at of the connection of interconnect 210 and capacitor pad 204, at the connection of interconnect (compact) readout resonator 106, and/or at the connection 328 of capacitor pad 304 and spiral coil 332) are well controlled/designed to avoid coupling of the qubits to lossy parts of the system (i.e., inductor 130 having spiral coil 332) because the lumped element resonator 106 has magnetic fields focused in the well-defined regions (e.g., the inductive part which is spiral coil 332 on readout plane 302) of the chip.

For ease of understanding, inductors are classified into three distinct categories to better understand location with respect to the qubit plane 202 and the readout plane 302, particular as it relates to placement of the capacitor (C) and inductor (L):

1) Josephson junctions are non-linear, lossless, lumped inductors. Josephson junctions provide the inductive part of the qubit LC resonators. As the term lossless suggests, Josephson junctions are not problematic from a loss perspective. Furthermore, the (inductive) energy in Josephson junctions is stored locally and the junctions in the qubits 102 interact inductively very little with the external circuit (other parts of the circuitry on the qubit plane 202 and/or the readout plane 302). Josephson junctions or series arrays of Josephson junctions can also be used as a replacement for spiral coil 332.

2) LC resonators that are only virtually excited, but not populated with photons. Bus resonators 104 between qubits fall into this category of LC resonators. By virtual excitation, a bus resonator 104 enables/facilitates transmission of a photon of frequencies different from its resonance frequency or harmonics thereof. Loss from these bus resonators (and their inductive parts) is not a concern, because the modes (i.e., the resonance frequency and its harmonics) of the resonator do not get excited. Furthermore, in practice, these bus resonators are made with very high quality factors (Q-factors), i.e., very low loss.

3) LC resonators, whose modes are directly excited (at their resonance frequency or potentially also a harmonic), are populated with (some) photons. In the example quantum circuits discussed herein, readout resonators 106 fall into this category. The readout resonator 106 also couple/connect to the external (off-chip) circuitry (all the way to room-temperature electronics). The experimenters are concerned about the loss created by readout resonator 106, and the loss is stronger in their inductive parts, and embodiments of the invention provide techniques and structures to move the inductive parts of the readout resonator 106 away from the (sensitive) qubits as discussed herein.

The circuit elements of the quantum/qubit circuit 100, the qubit plane 202, and the readout plane 302 can be made of superconducting material. The respective resonators, inductors, capacitors, interconnects (e.g., solder bump and TSV), transmission lines, qubits, ground planes, spiral coils, etc., are made of superconducting materials. Examples of superconducting materials (at low temperatures, such as about 10-100 millikelvin (mK), or about 4 K) include niobium, aluminum, tantalum, etc. For example, the Josephson junctions are made of superconducting material, and their tunnel junctions can be made of a thin tunnel barrier, such as an oxide. The capacitors can be made of superconducting material separated by low-loss dielectric material, air, etc. The transmission lines (i.e., wires) connecting the various elements are made of a superconducting material.

Figure 7:
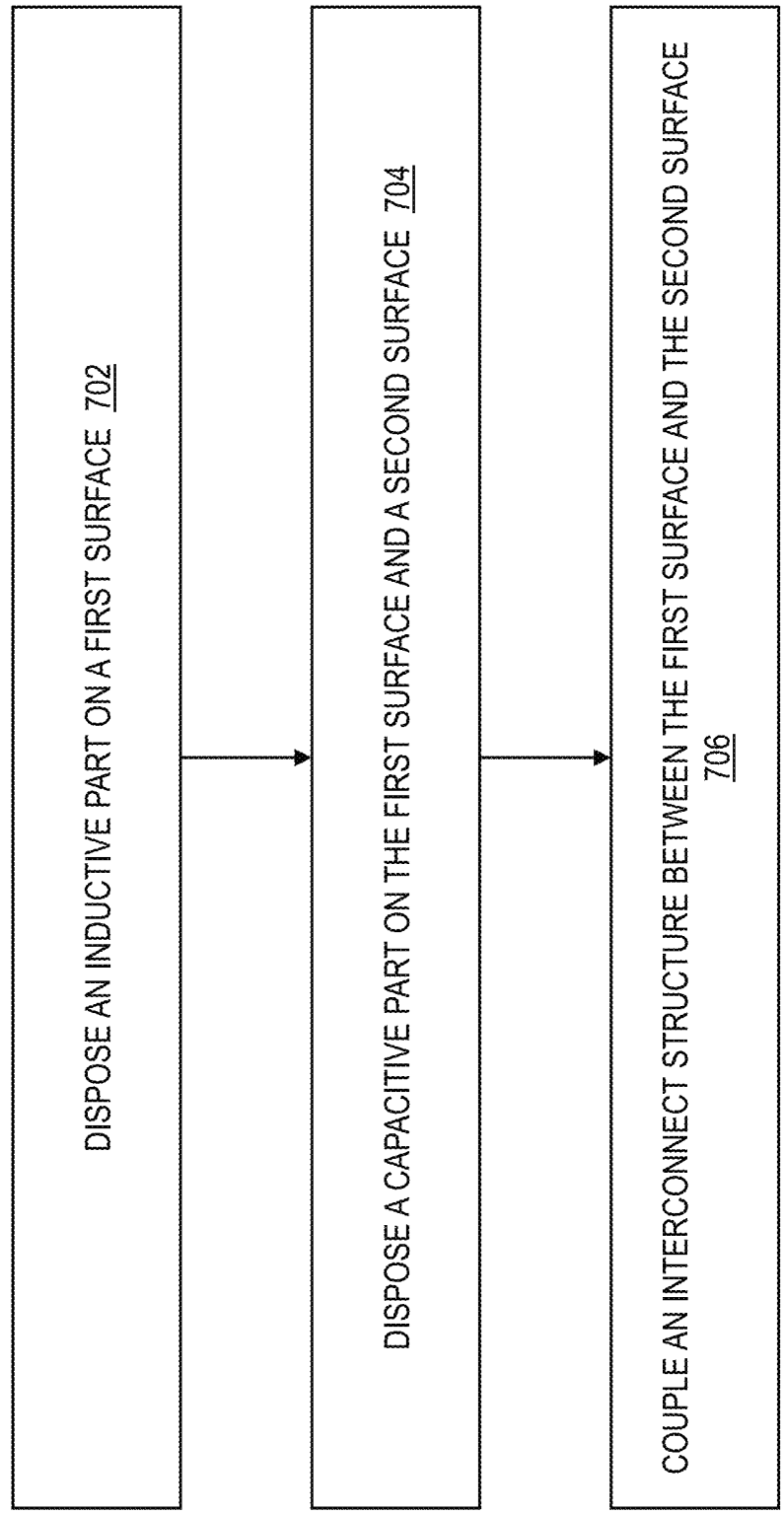
FIG. 7 depicts a flow chart of method of forming a structure according to embodiments of the invention.

FIG. 7 depicts a flow chart 700 of method of forming a structure (e.g., resonator 106) according to embodiments of the invention. At block 702, an inductive part (e.g., inductor 130) is disposed on a first surface (e.g., readout plane 302). At block 704, a capacitive part is disposed on the first surface (e.g., readout plane 302) and a second surface (e.g., qubit plane 202). At block 706, an interconnect structure (e.g., interconnect 210) is coupled/connected between the first surface and the second surface (e.g., between the readout plane 302 and qubit plane 202).

The capacitive part includes the interconnect structure. For example, the capacitor 150 includes the capacitor pad 204, the capacitor pad 304, and interconnect 210. The inductive part (e.g., the inductor 130) is selected from the group consisting of a spiral coil, a spiral-like coil, a meandering wire/transmission line, a (straight) kinetic inductor (with high kinetic inductance material), a Josephson junction, and/or a series array of Josephson junctions. An example spiral coil 332, which can be in any meandering wire-like shape, is depicted in FIG. 3. The inductive part is shunted to ground. For example, the spiral coil 332 is shunted to the ground plane 306 at connection 326.

The capacitive part is selected from the group consisting of a plate capacitor and/or an interdigitated capacitor. For example, the capacitor pad 204 and capacitor pad 304 can be formed as a plate capacitor and/or an interdigital/interdigitated capacitor (i.e., finger capacitor) with the interconnect 210 in between.

The interconnect structure is a solder bump, as depicted in FIG. 4. The interconnect structure is a through-silicon via, as depicted in FIG. 5.

At least one signal delivery line is coupled to the inductive part of the resonator 106. For example, the transmission line 322 (i.e., signal delivery line) is coupled to the spiral coil 332, as depicted in FIG. 3. In some implementations, the transmission line 322 can be inductively coupled to the spiral coil 332. At least one signal delivery line is coupled to the capacitive part of the resonator. For example, a transmission line just like the transmission line 322 can be capacitively (or inductively) coupled to capacitor pad 204 in FIG. 2, although not shown.

At least one superconducting qubit 102 is coupled to the capacitive part of the resonator. For example, the qubit 102 is capacitively coupled to the capacitor pad 204 of the readout resonator 106, as depicted in FIGS. 1, 2, and 6. As another option, at least one superconducting qubit 102 is coupled to the inductive part of the resonator 106. For example, the qubit 102 could be coupled to the spiral coil 332 if the qubit 102 is placed on the readout plane 302 with spiral coil 332, although not shown.

The inductive part and capacitive part (including interconnect structure 210) are made of superconducting metal. The capacitive part and the interconnect structure are equipotential, i.e., have the same voltage or potential. The first surface (e.g., readout plane 302) opposes the second surface (e.g., qubit plane 202).

Figure 8:
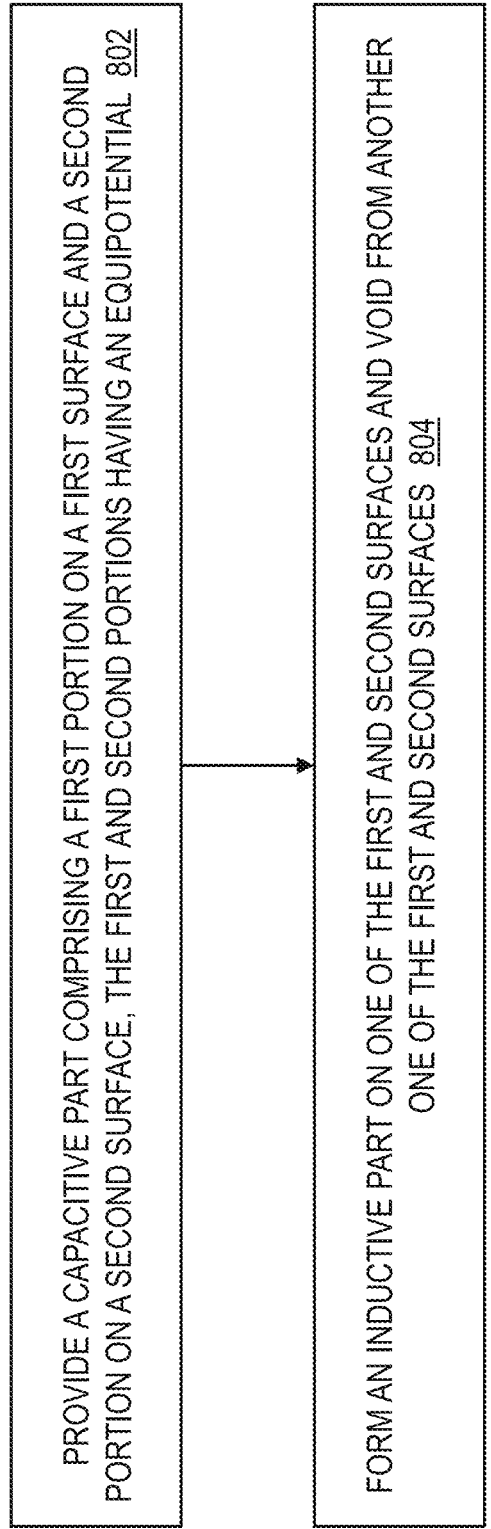
FIG. 8 depicts a flow chart of method of forming a structure according to embodiments of the invention.

FIG. 8 depicts a flow chart 800 of method of forming a structure (e.g., readout resonator 106) according to embodiments of the invention. At block 802, a capacitive part (e.g., capacitor 150) is formed with a first portion (e.g., capacitor pad 304) on a first surface (e.g., readout plane 302) and a second portion (e.g., capacitor pad 204) on a second surface (e.g., qubit plane 202), where the first and second portions having an equipotential.

At block 804, an inductive part (e.g., inductor 130) on one of the first and second surfaces and void/absent from another one of the first and second surfaces. The inductive part 130 is depicted on the readout plane 302, as depicted in FIGS. 3, 4, and 5. However, the inductive part 130 could be on the qubit plane 202.

An interconnect structure 210 connects the first and second portions (e.g., capacitor pads 204 and 304) to thereby have the equipotential.

Figure 9:
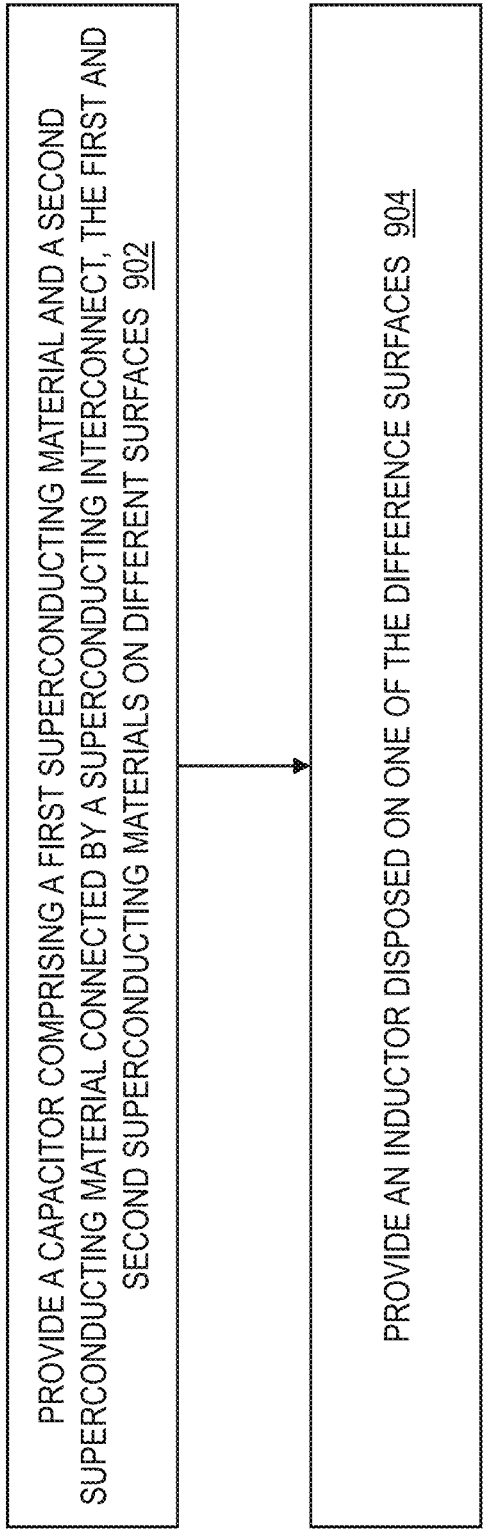
FIG. 9 depicts a flow chart of method of forming a structure according to embodiments of the invention.

FIG. 9 depicts a flow chart 900 of method of forming a resonator (e.g., readout resonator 106) according to embodiments of the invention. At block 902, a capacitor 150 formed with a first superconducting material (e.g., capacitor pad 204) and a second superconducting material (e.g., capacitor pad 304) connected by a superconducting interconnect 210, where the first and second superconducting materials are on different surfaces (e.g., the qubit plane 202 and the readout plane 302). At block 904, an inductor 130 is disposed on one of the different surfaces (e.g., one of the qubit plane 202 and the readout plane 302 but not both). For example, the inductor 130 is disposed on either the qubit plane 202 or the readout plane 302.

Examples of the lumped compact resonator having inductive and capacitive elements in which the inductive element is on an isolated plane have been discussed above using a solder bump and through-silicon via. Additional examples of lumped resonators having various types of structures for the inductive element are described in FIGS. 10-25.

Figure 10:
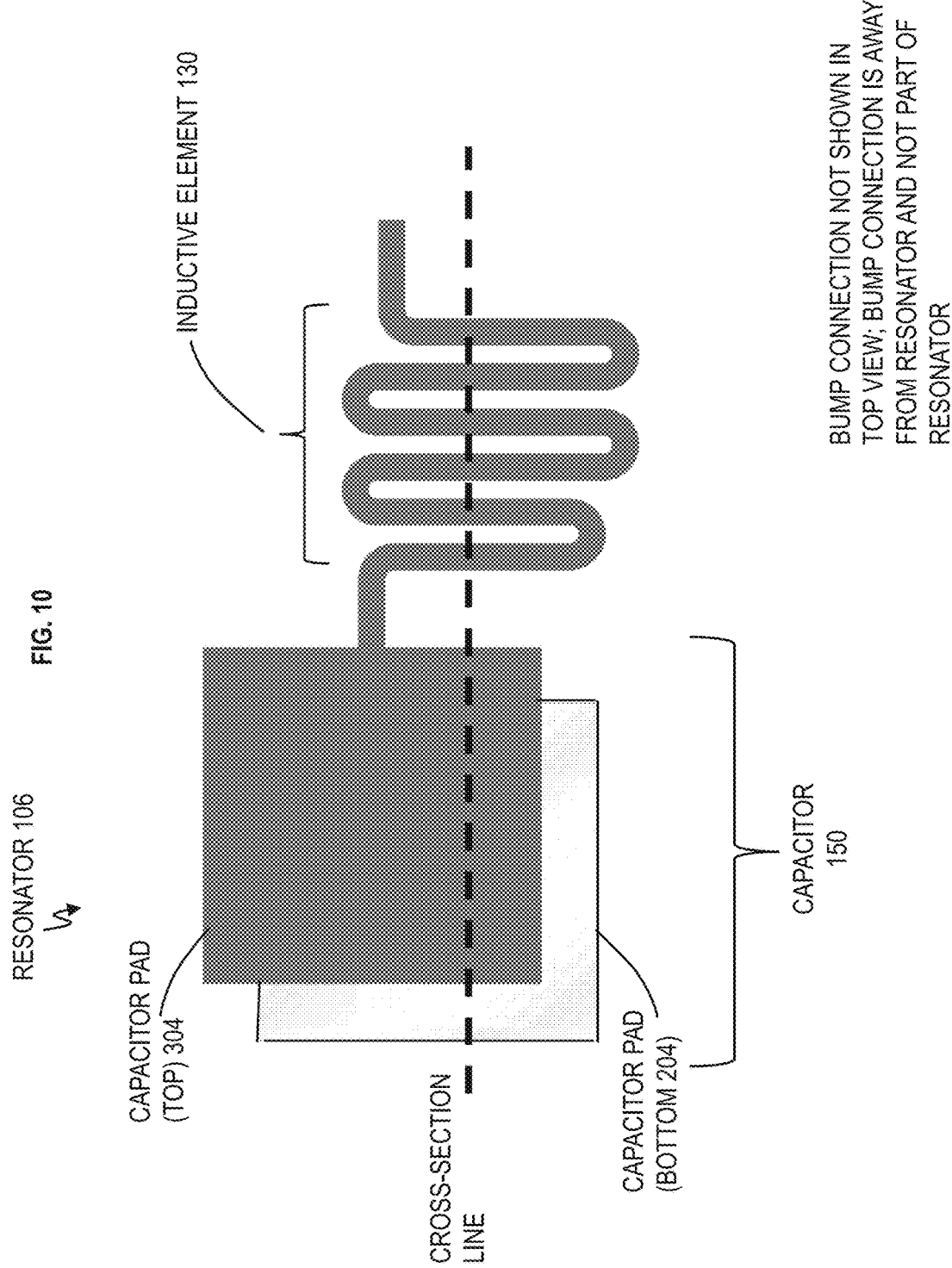
FIG. 10 depicts a simplified version of a top view for an example resonator according to embodiments of the invention.

FIG. 10 depicts a simplified version of a top view for an example resonator according to embodiments of the invention. The resonator can be, for example, a readout resonator 106. In FIG. 10, the readout resonator 106 has a top capacitor pad 304 and a bottom capacitor pad 204, which form the capacitor 150. The top capacitor pad 304 is connected to the inductive element 130. The inductive element 130 is depicted as a meandering transmission line.

Figure 11:
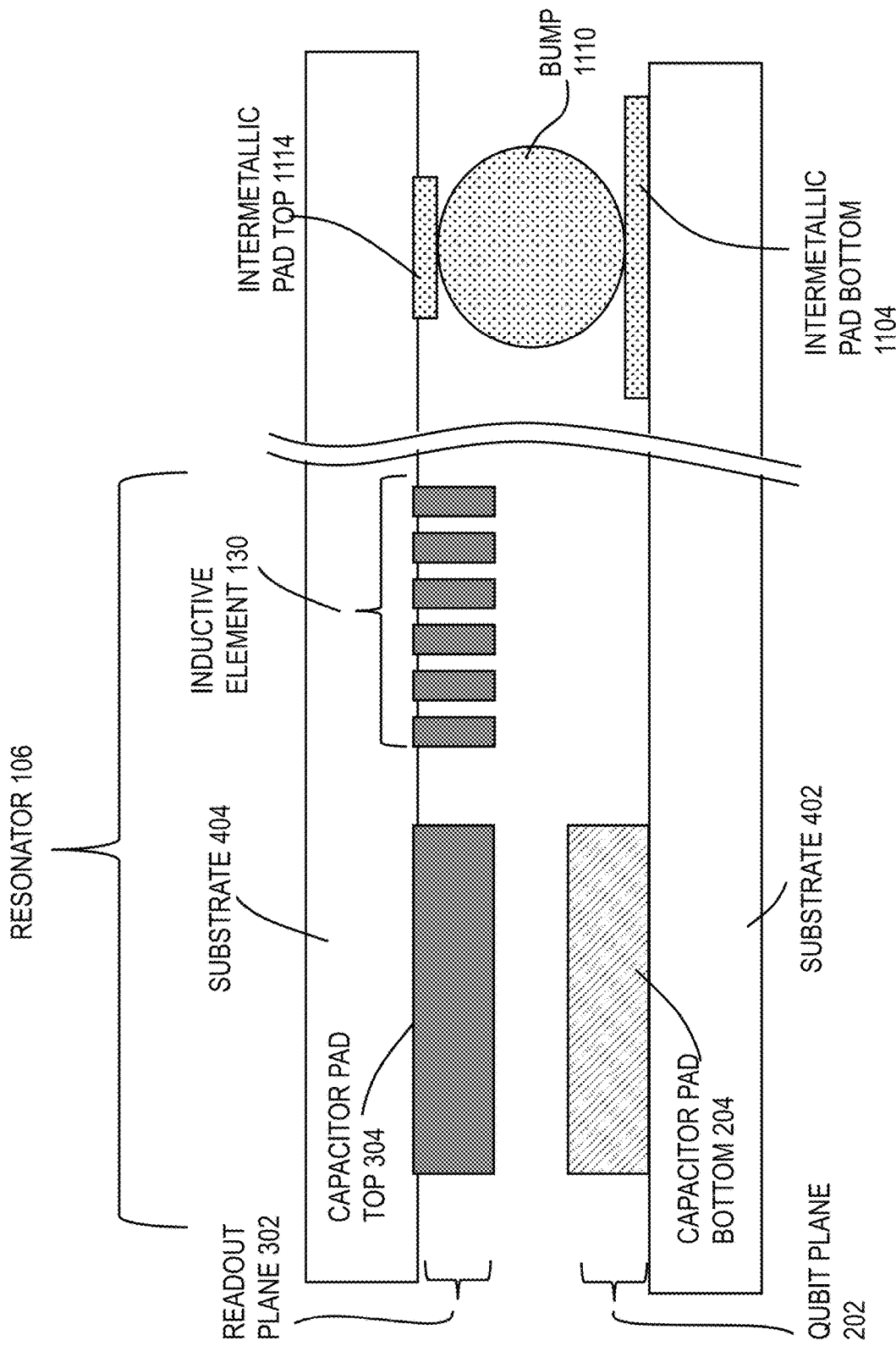
FIG. 11 depicts a cross-sectional view of the resonator in FIG. 10 according to embodiments of the invention.

FIG. 11 is a cross-sectional view of the resonator in FIG. 10 according to embodiments of the invention. FIG. 11 only illustrates an example portion of a superconducting qubit circuit 100 and it is understood that other circuit elements are present. FIG. 11 shows the bottom capacitor pad 204 on the qubit plane 202 (where the qubits are not shown) and the top capacitor pad 304 on the readout plane 302, thereby forming the capacitor 150.

The inductive element 130 is (only) on the readout plane 302 and is connected to the top capacitor pad 304. As can be seen in FIGS. 10 and 11, the inductive element 130 is not limited to a spiral coil 332 but can be other shapes and/or designs, according to embodiments of the invention. The qubit plane 202 (circuit plane) and the bottom substrate 402 together form a bottom chip, and the readout plane 302 (circuit plane) and the top substrate 404 together form a top chip.

In addition to the readout resonator 106, a solder bump 1110 is shown connecting the qubit plane 202 and readout plane 302. One or more solder bumps 1110 can be utilized to connect, for example, ground planes on the qubit plane 202 to the readout plane 302 and/or to connect other circuit elements between the qubit and readout planes as needed. The solder bump 1110 can be connected to a top intermetallic pad 1114 of the readout plane 302 and connected to a bottom intermetallic pad 1104 of the qubit plane 202. The solder bump 1110, the top intermetallic pad 1114, and the bottom intermetallic pad 1104 are made of superconducting material. The solder bump 1110, the top intermetallic pad 1114, and the bottom intermetallic pad 1104 can be formed when forming the capacitor pad 204, capacitor pad 304, and interconnect 210 of the bump resonator when the bump resonator is on the circuit 100.

Figure 12:
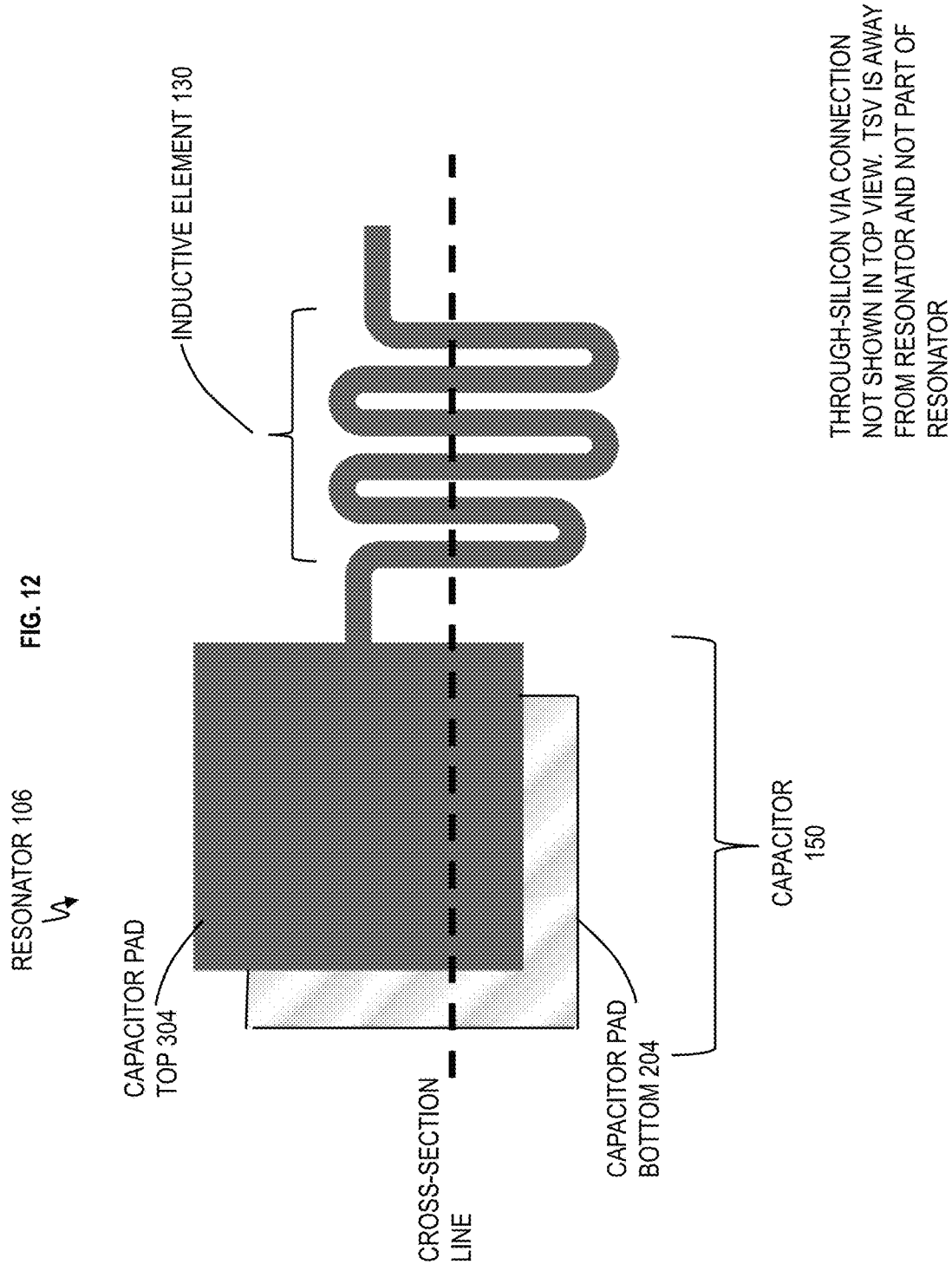
FIG. 12 depicts a simplified version of a top view for an example resonator according to embodiments of the invention.

FIG. 12 depicts a simplified version of a top view for an example resonator according to embodiments of the invention. The resonator can be, for example, a readout resonator 106. In FIG. 12, the readout resonator 106 has a top capacitor pad 304 and a bottom capacitor pad 204, which form the capacitor 150. The top capacitor pad 304 is connected to the inductive element 130. Again, the inductive element 130 is depicted as a meandering transmission line.

Figure 13:
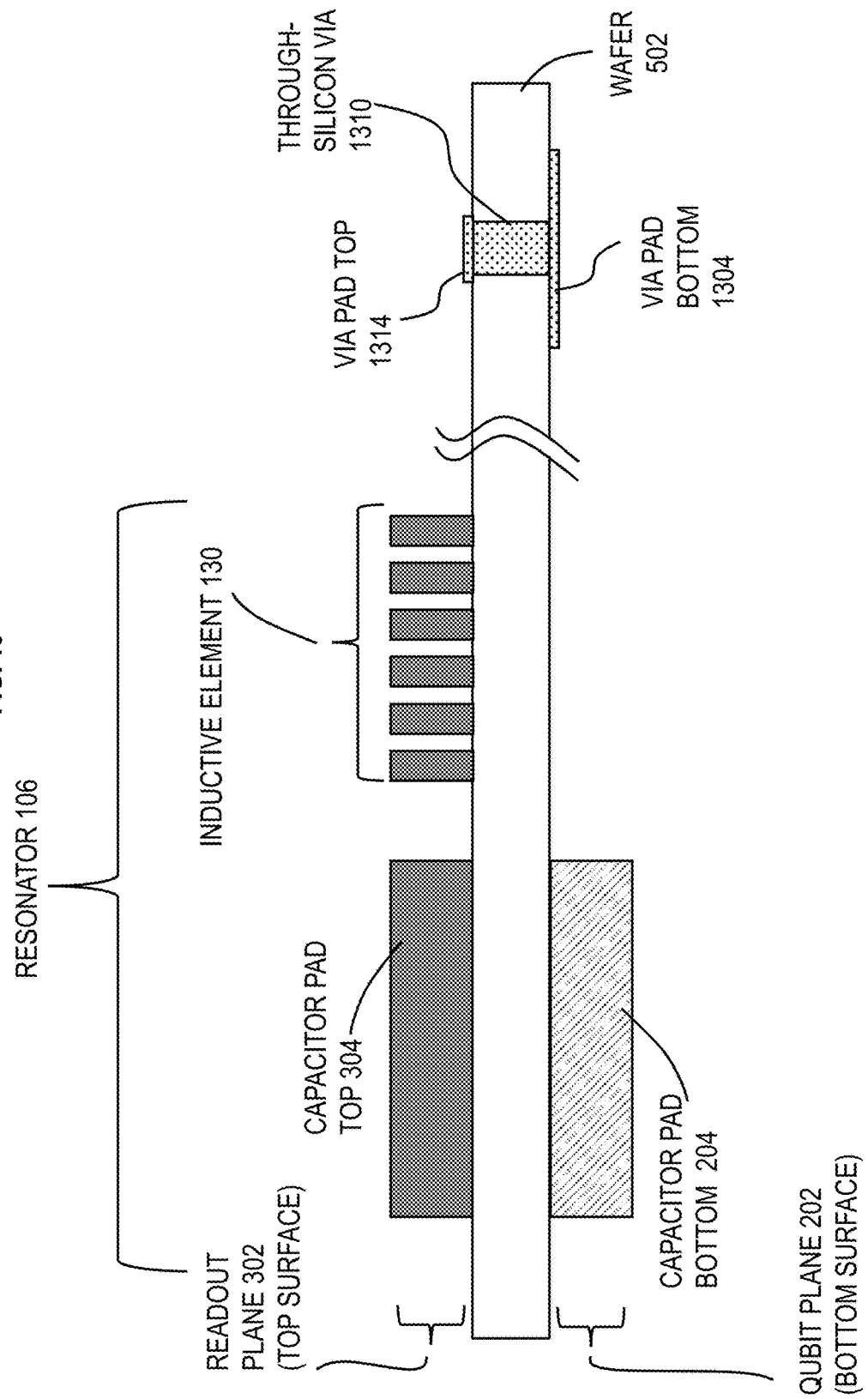
FIG. 13 depicts a cross-sectional view of the resonator in FIG. 12 according to embodiments of the invention.

FIG. 13 is a cross-sectional view of the resonator in FIG. 12 according to embodiments of the invention. FIG. 13 only illustrates an example portion of a superconducting qubit circuit 100 and it is understood that other circuit elements are present. FIG. 13 shows the bottom capacitor pad 204 on the qubit plane 202 (and the qubit is not shown) and the top capacitor pad 304 on the readout plane 302, thereby forming the capacitor 150. The inductive element 130 is (only) on the readout plane 302 and is connected to the top capacitor pad 304. As can be seen in FIGS. 12 and 13, the inductive element 130 is not limited to a spiral coil 332 but can be other shapes and/or designs, according to embodiments of the invention. The qubit plane 202 (circuit plane) and readout plane 302 (circuit plane) are (circuits) formed on opposite sides of the wafer 502.

In addition to the readout resonator 106, (unlike FIG. 11) FIG. 13 shows a through-silicon via 1310 connecting the qubit plane 202 and readout plane 302. One or more through-silicon vias 1310 can be utilized to connect, for example, ground planes on the qubit plane 202 to the readout plane 302 and/or to connect other circuit elements between the qubit and readout planes as needed. The through-silicon vias 1310 can be connected to a top via pad 1314 of the readout plane 302 and connected to a bottom via pad 1304 of the qubit plane 202. The through-silicon via 1310, top via pad 1314, and the bottom via pad 1304 are made of superconducting materials as discussed herein. The through-silicon via 1310, top via pad 1314, and the bottom via pad 1304 can be formed when forming the capacitor pad 204, capacitor pad 304, and interconnect 210 of the TSV resonator when the TSV resonator is on the circuit 100.

Figure 14:
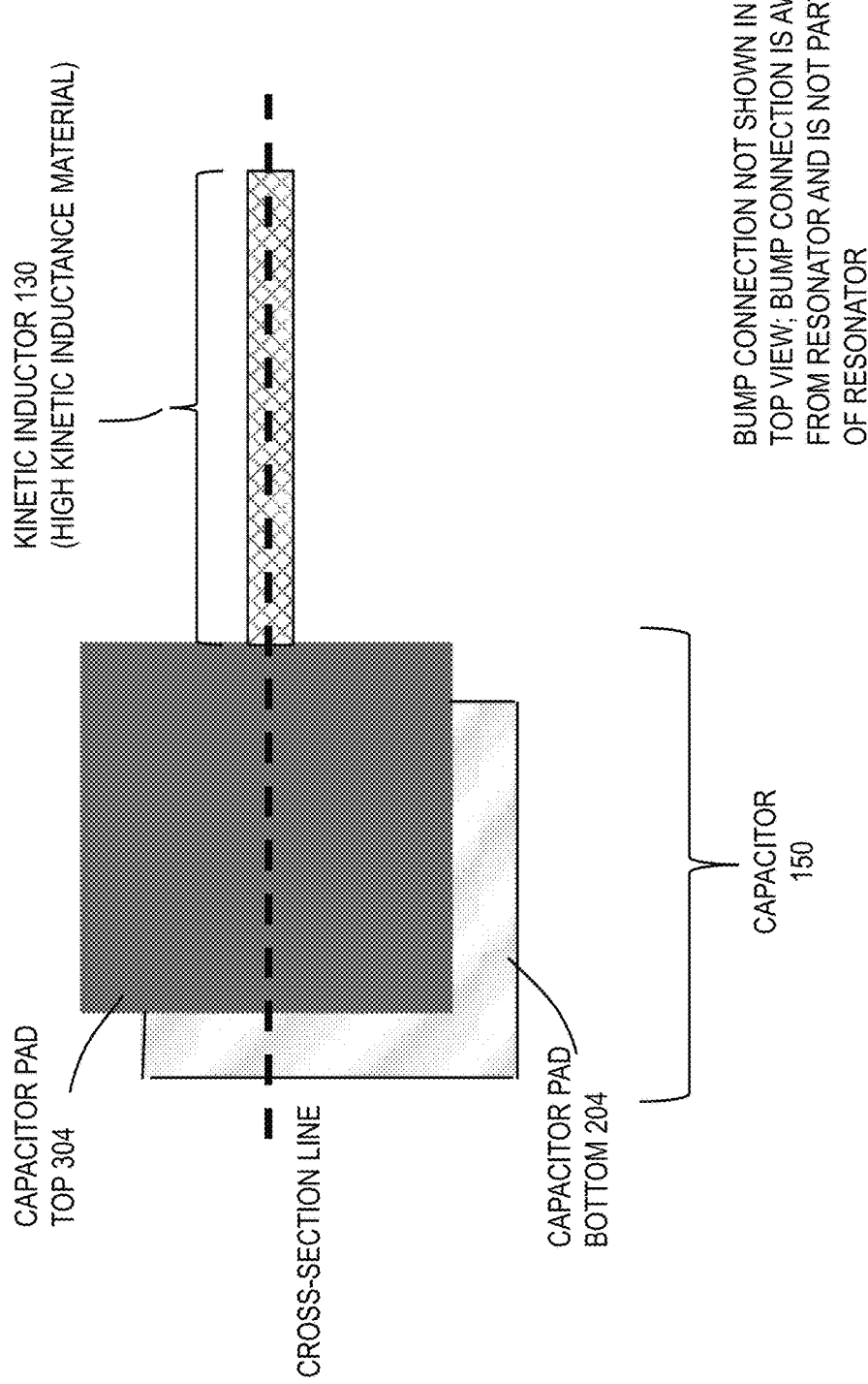
FIG. 14 depicts a simplified version of a top view for an example resonator according to embodiments of the invention.

FIG. 14 depicts a simplified version of a top view for an example resonator according to embodiments of the invention. The resonator can be, for example, a readout resonator 106. In FIG. 14, the readout resonator 106 has a top capacitor pad 304 and a bottom capacitor pad 204, which form the capacitor 150. The top capacitor pad 304 is connected to the inductive element 130. The inductive element 130 is depicted as a kinetic inductor formed of high kinetic inductance material, and the kinetic inductor can be formed in a straight line, nearly a straight line, a diagonal line, etc. As noted above, high kinetic inductance material for the kinetic inductor can include niobium nitride (NbN), niobium titanium nitride (NbTiN), and/or titanium nitride (TiN).

Figure 15:
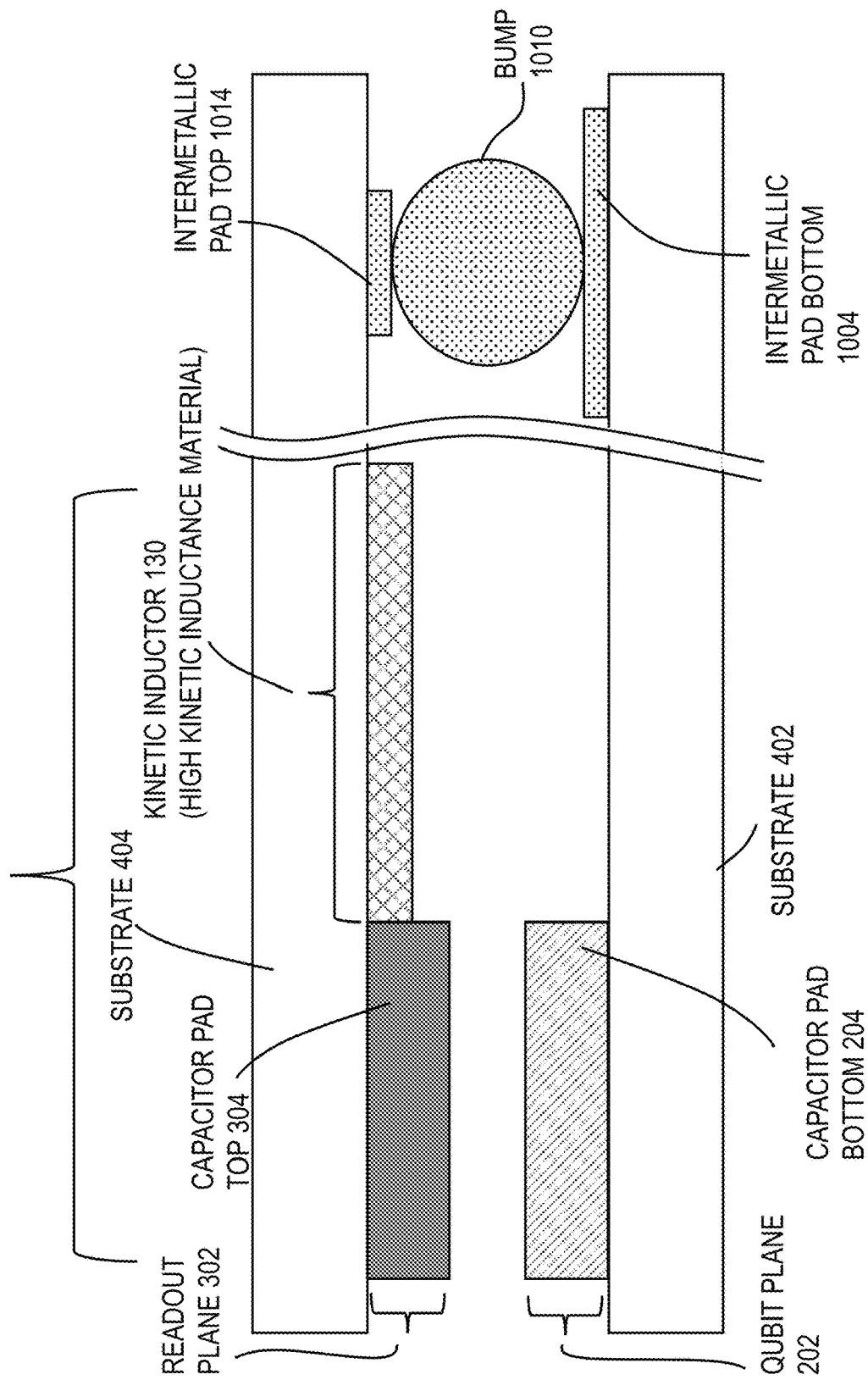
FIG. 15 depicts a cross-sectional view of the example resonator in FIG. 14 according to embodiments of the invention.

FIG. 15 is a cross-sectional view of the example resonator in FIG. 14 according to embodiments of the invention. FIG. 15 only illustrates an example portion of a superconducting qubit circuit 100 and it is understood that other circuit elements are present. FIG. 15 shows the bottom capacitor pad 204 on the qubit plane 202 (where the qubits are not shown) and the top capacitor pad 304 on the readout plane 302, thereby forming the capacitor 150.

The inductive element 130 is (only) on the readout plane 302 and is connected to the top capacitor pad 304. As can be seen in FIGS. 14 and 15, the inductive element 130 is not limited to a spiral coil 332 but can be other shapes and/or designs, according to embodiments of the invention. The qubit plane 202 (circuit plane) and the bottom substrate 402 together form a bottom chip, and the readout plane 302 (circuit plane) and the top substrate 404 together form a top chip.

In addition to the readout resonator 106, a solder bump 1110 is shown connecting the qubit plane 202 and readout plane 302. One or more solder bumps 1110 can be utilized to connect, for example, ground planes on the qubit plane 202 to the readout plane 302 and/or to connect other circuit elements between the qubit and readout planes as needed. The solder bump 1110 can be connected to a top intermetallic pad 1114 of the readout plane 302 and connected to a bottom intermetallic pad 1104 of the qubit plane 202. The solder bump 1110, the top intermetallic pad 1114, and the bottom intermetallic pad 1104 are made of superconducting material.

Figure 16:
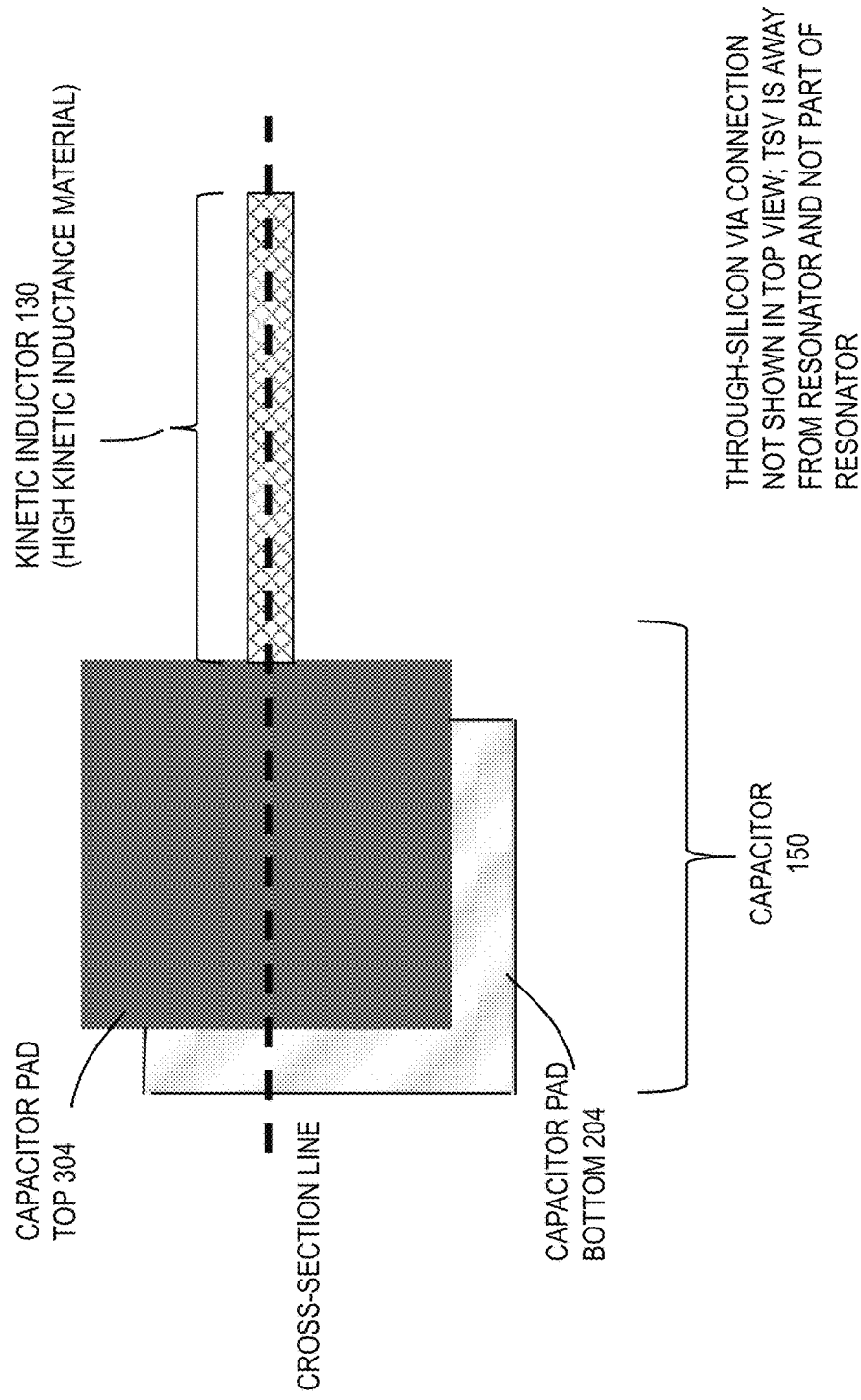
FIG. 16 depicts a simplified version of a top view for an example resonator according to embodiments of the invention.

FIG. 16 depicts a simplified version of a top view for an example resonator according to embodiments of the invention. The resonator can be, for example, a readout resonator 106. In FIG. 16, the readout resonator 106 has a top capacitor pad 304 and a bottom capacitor pad 204, which form the capacitor 150. The top capacitor pad 304 is connected to the inductive element 130. Again, the inductive element 130 is depicted as a kinetic inductor formed of high kinetic inductance material as discussed above.

Figure 17:
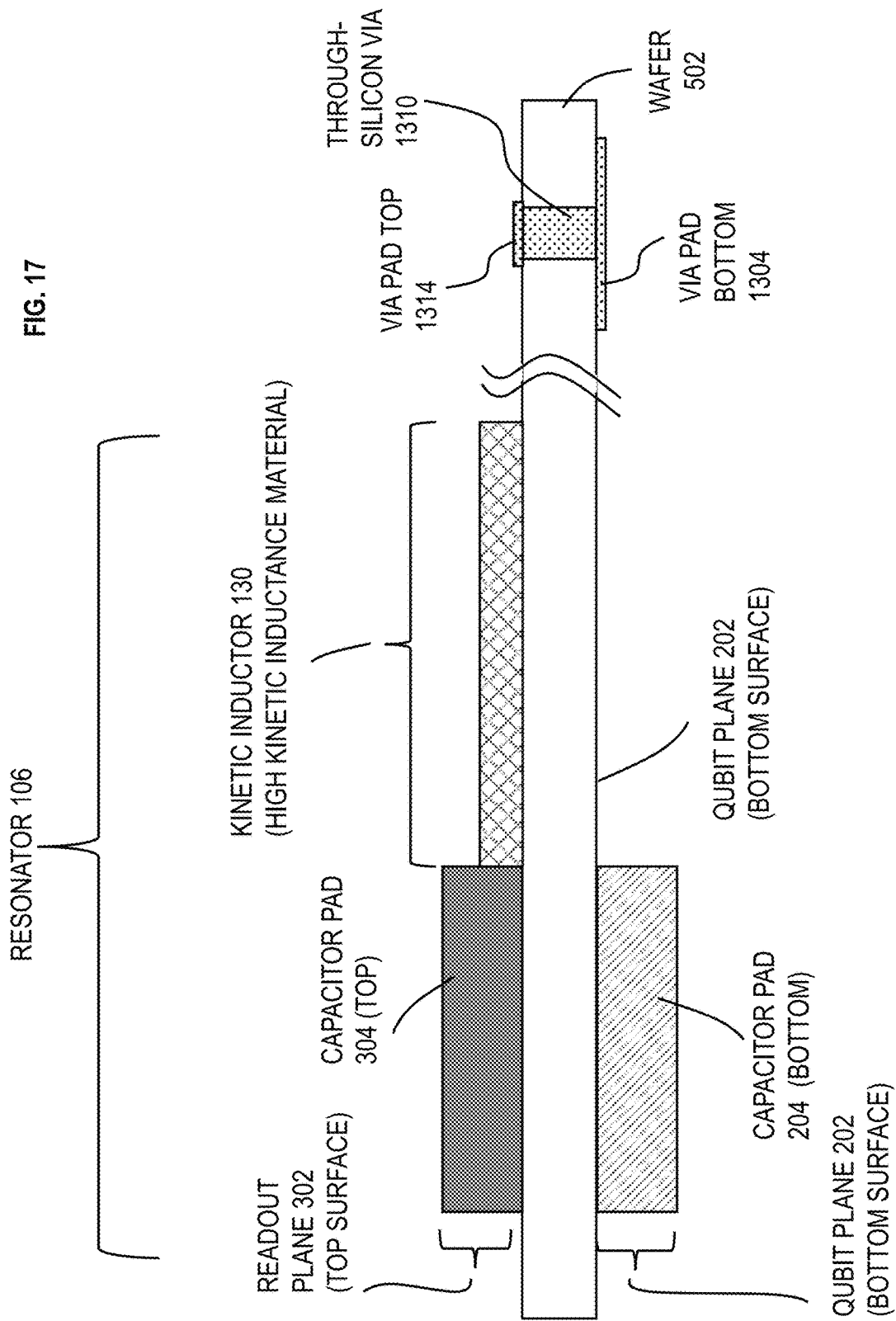
FIG. 17 depicts a cross-sectional view of the resonator in FIG. 16 according to embodiments of the invention.

FIG. 17 is a cross-sectional view of the resonator in FIG. 16 according to embodiments of the invention. FIG. 17 only illustrates an example portion of a superconducting qubit circuit 100 and it is understood that other circuit elements are present. FIG. 17 shows the bottom capacitor pad 204 on the qubit plane 202 (and the qubit is not shown) and the top capacitor pad 304 on the readout plane 302, thereby forming the capacitor 150. The inductive element 130 is (only) on the readout plane 302 and is connected to the top capacitor pad 304. As can be seen in FIGS. 16 and 17, the inductive element 130 is not limited to a spiral coil 332 but can be other shapes and/or designs, according to embodiments of the invention. The qubit plane 202 (circuit plane) and readout plane 302 (circuit plane) are (circuits) formed on opposite sides of the wafer 502.

In addition to the readout resonator 106, (unlike FIG. 15) FIG. 17 shows a through-silicon via 1310 connecting the qubit plane 202 and readout plane 302. One or more through-silicon vias 1310 can be utilized to connect, for example, ground planes on the qubit plane 202 to the readout plane 302 and/or to connect other circuit elements between the qubit and readout planes as needed. The through-silicon vias 1310 can be connected to a top via pad 1314 of the readout plane 302 and connected to a bottom via pad 1304 of the qubit plane 202. The through-silicon via 1310, top via pad 1314, and the bottom via pad 1304 are made of superconducting materials as discussed herein.

Figure 18:
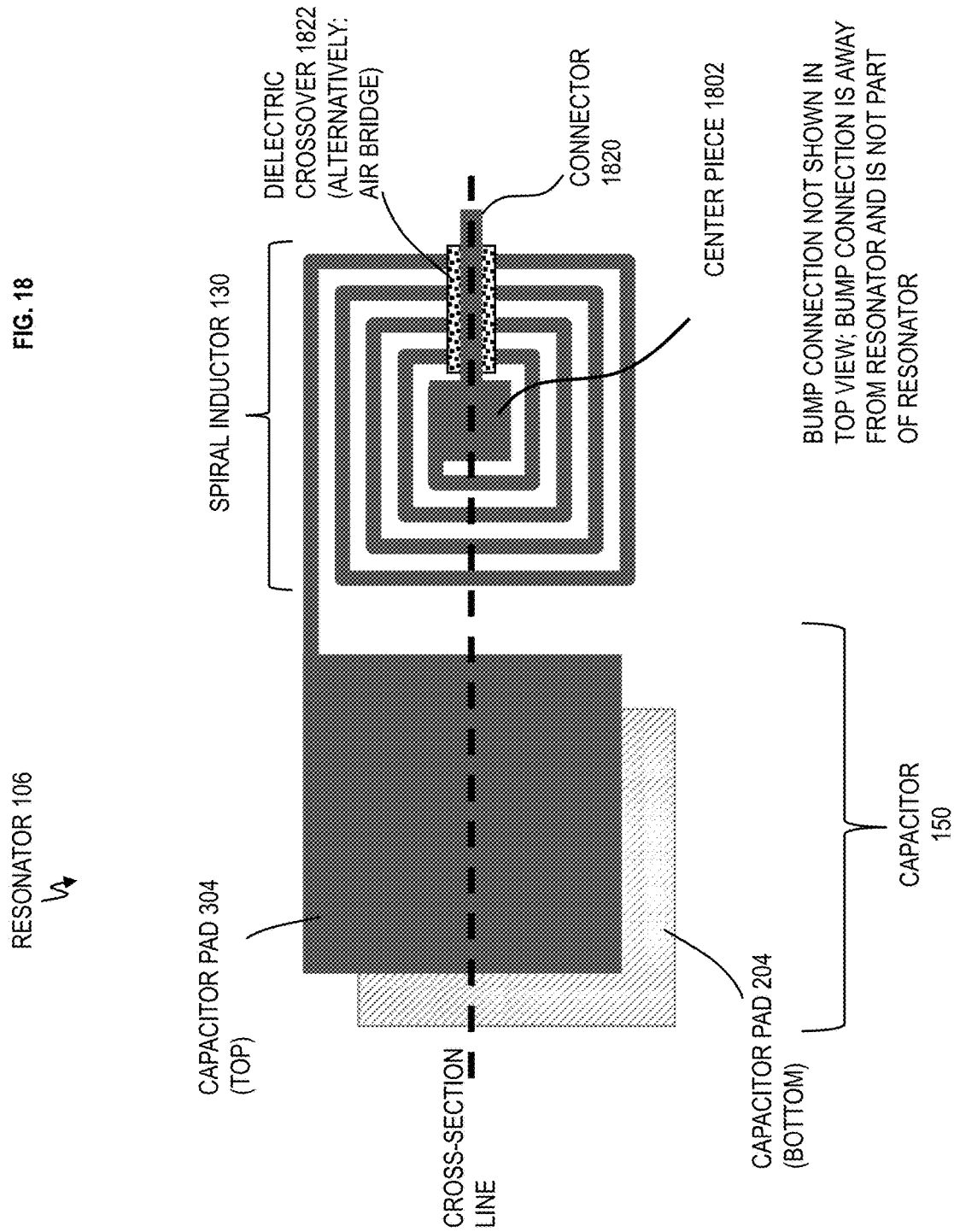
FIG. 18 depicts a simplified version of a top view for an example resonator according to embodiments of the invention.

FIG. 18 depicts a simplified version of a top view for an example resonator according to embodiments of the invention. The resonator can be, for example, a readout resonator 106. In FIG. 18, the readout resonator 106 has a top capacitor pad 304 and a bottom capacitor pad 204, which form the capacitor 150. The top capacitor pad 304 is connected to the inductive element 130. The inductive element 130 is depicted as a spiral inductor transmission line connected to any the side of the capacitor 150. The spiral inductive element 130 has a center piece 1802. One end of the spiral transmission line connects to the top capacitor pad 304 and the other end of the spiral transmission line connects to the center piece 1802. A connector 1820 connects to the center piece 1802, and the connector 1820 can be connected to another circuit element such as a transmission line for external connection. A dielectric crossover 1822 is underneath the connector 1820 so as to separate the connector 1820 from the spiral transmission line underneath. In some implementations, the dielectric crossover 1822 can be an air bridge such that the dielectric crossover 1822 is air or space between the connector 1820 and spiral transmission line underneath. In some implementations, the dielectric crossover 1822 can be a dielectric material, such as an oxide, nitride, etc. The inductor 130 including the spiral transmission line and the center piece 1802 (along with the connector 1820) and the capacitor 150 including the top capacitor pad 304 and the bottom capacitor 204 can be formed of superconducting material.

Figure 19:
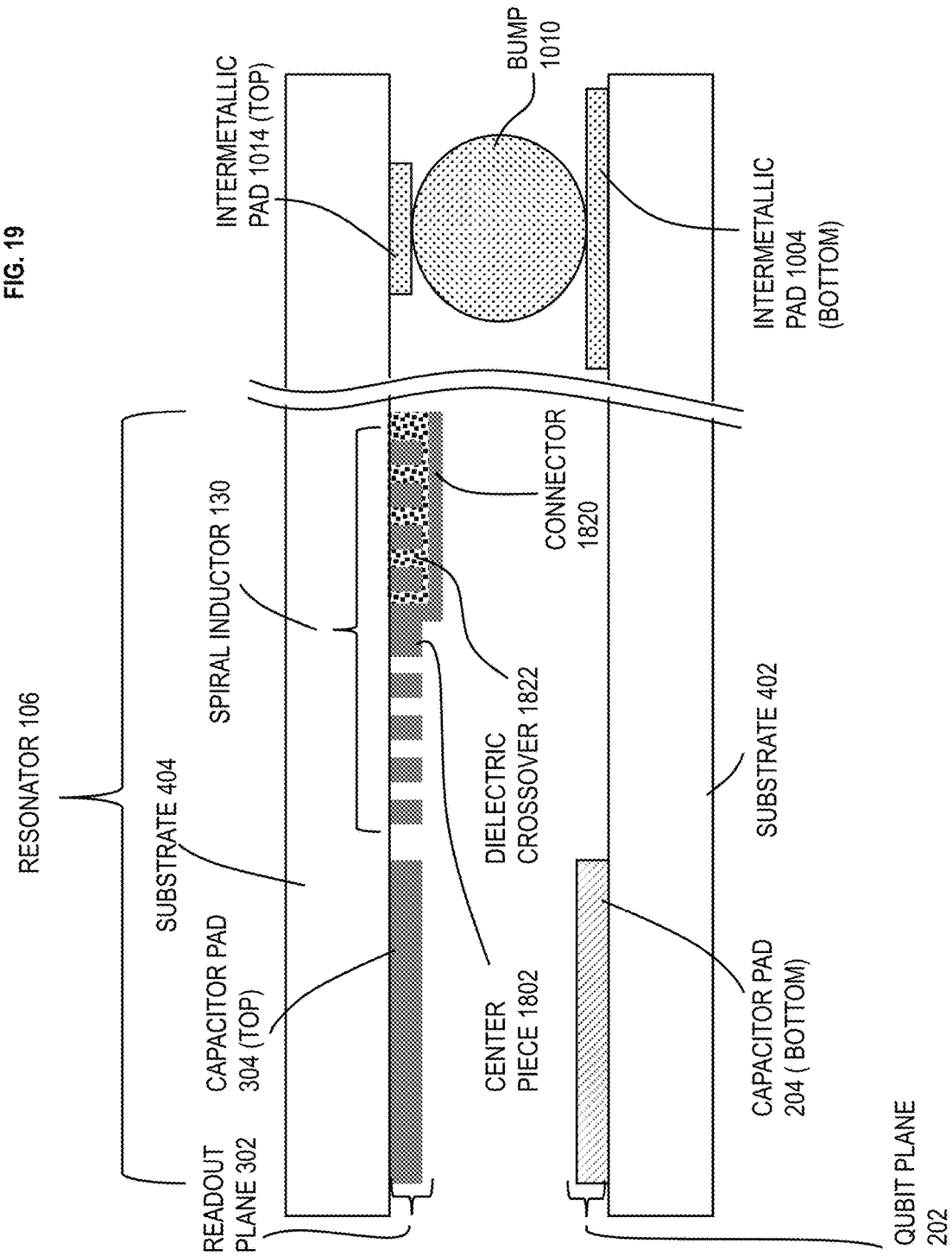
FIG. 19 depicts a cross-sectional view of the resonator in FIG. 18 according to embodiments of the invention.

FIG. 19 is a cross-sectional view of the resonator in FIG. 18 according to embodiments of the invention. FIG. 19 only illustrates an example portion of a superconducting qubit circuit 100 and it is understood that other circuit elements are present. FIG. 19 shows the bottom capacitor pad 204 on the qubit plane 202 (where the qubits are not shown) and the top capacitor pad 304 on the readout plane 302, thereby forming the capacitor 150.

The inductive element 130 is (only) on the readout plane 302 and is connected to the top capacitor pad 304. As can be seen in FIGS. 18 and 19, the inductive element 130 is not limited to a spiral coil 332 around the capacitor but can be other shapes and/or designs and in other locations, according to embodiments of the invention. The qubit plane 202 (circuit plane) and the bottom substrate 402 together form a bottom chip, and the readout plane 302 (circuit plane) and the top substrate 404 together form a top chip.

In addition to the readout resonator 106, a solder bump 1110 is shown connecting the qubit plane 202 and readout plane 302. One or more solder bumps 1110 can be utilized to connect, for example, ground planes on the qubit plane 202 to the readout plane 302 and/or to connect other circuit elements between the qubit and readout planes as needed. Details of the solder bump 1110, top intermetallic pad 1114, and bottom intermetallic pad 1104 have been discussed herein.

Figure 20:
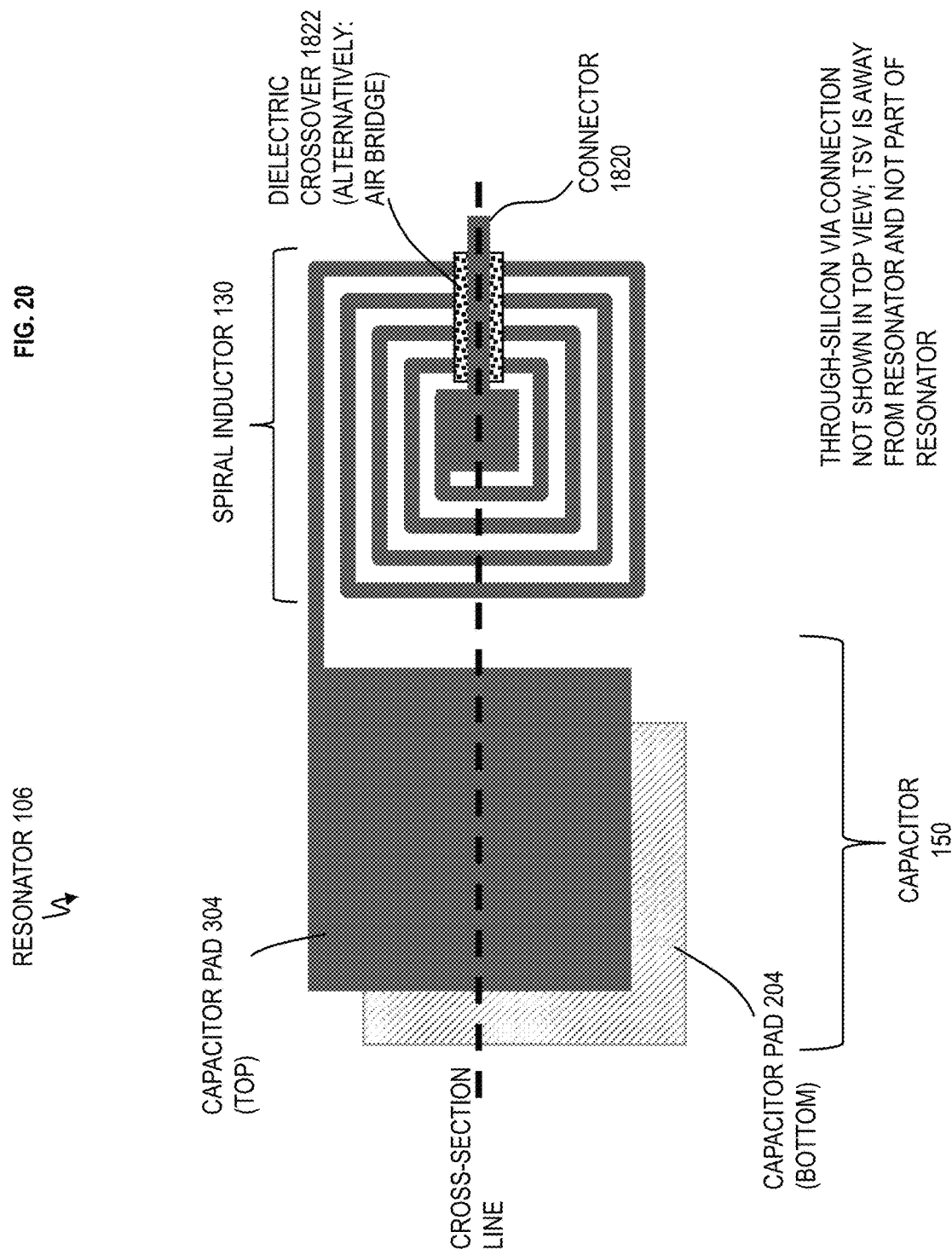
FIG. 20 depicts a simplified version of a top view for an example resonator according to embodiments of the invention.

FIG. 20 depicts a simplified version of a top view for an example resonator according to embodiments of the invention. The resonator can be, for example, a readout resonator 106. In FIG. 20, the readout resonator 106 has a top capacitor pad 304 and a bottom capacitor pad 204, which form the capacitor 150. The top capacitor pad 304 is connected to the inductive element 130. Again, the inductive element 130 is depicted as a spiral inductor transmission line connected to any the side of the capacitor 150. The spiral inductive element 130 has a center piece 1802. One end of the spiral transmission line connects to the top capacitor pad 304 and the other endo of the spiral transmission line connects to the center piece 1802. A connector 1820 connects to the center piece 1802, the connector 1820 can be connected to another circuit element such as a transmission line for external connection. A dielectric crossover 1822 is underneath the connector so as to separate the connector 1820 from the spiral transmission line underneath. In some implementations, the dielectric crossover 1822 can be an air bridge such that the dielectric crossover 1822 is air or space between the connector 1820 and spiral transmission line. In some implementations, the dielectric crossover 1822 can be a dielectric material, such as an oxide, nitride, etc. The inductor 130 including the spiral transmission line and the center piece 1802 (along with the connector 1820) and the capacitor 150 including the top capacitor pad 304 and the bottom capacitor 204 can be formed of superconducting material.

Figure 21:
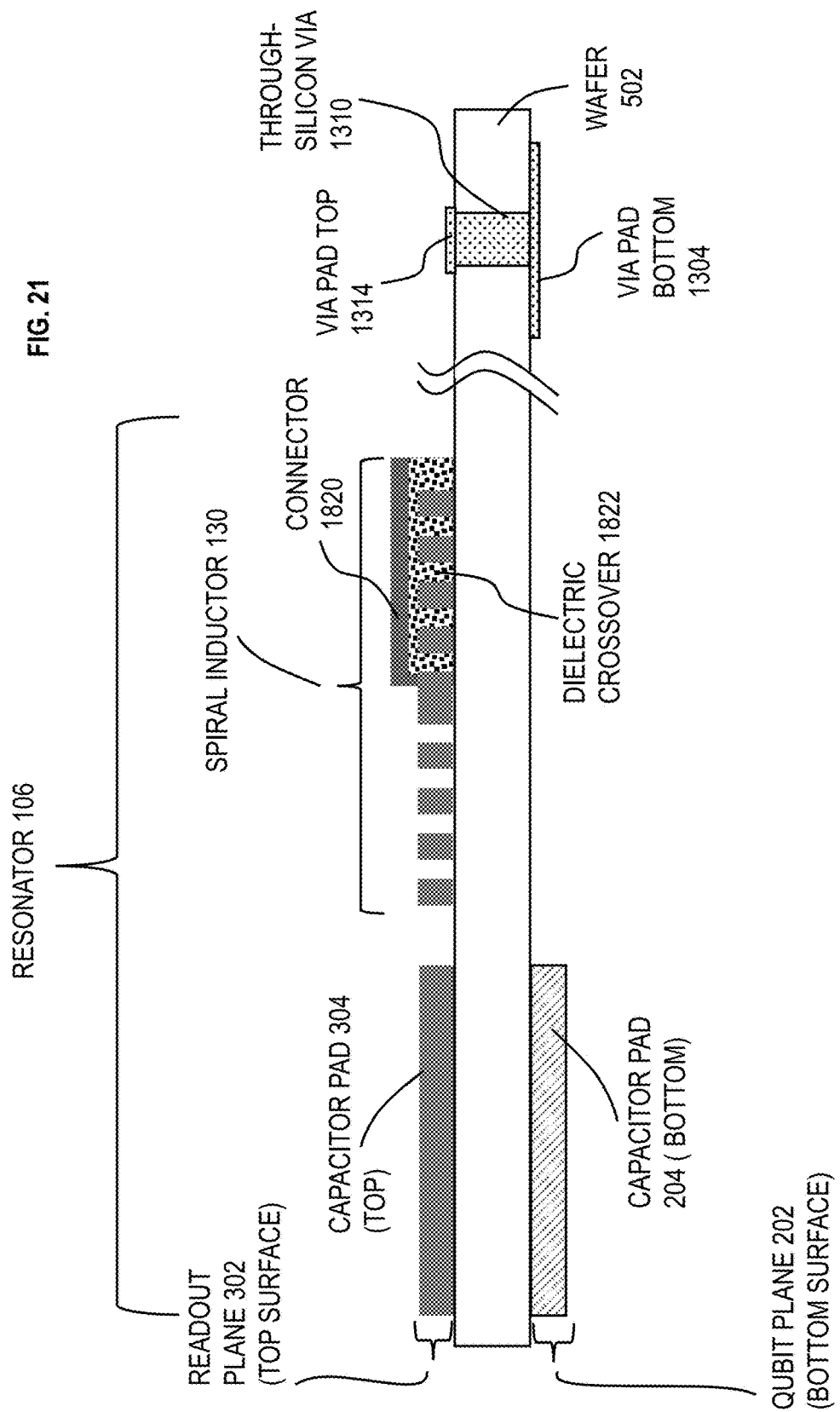
FIG. 21 depicts a cross-sectional view of the resonator in FIG. 20 according to embodiments of the invention.

FIG. 21 is a cross-sectional view of the resonator in FIG. 20 according to embodiments of the invention. FIG. 20 only illustrates an example portion of a superconducting qubit circuit 100 and it is understood that other circuit elements are present. FIG. 20 shows the bottom capacitor pad 204 on the qubit plane 202 (and the qubit is not shown) and the top capacitor pad 304 on the readout plane 302, thereby forming the capacitor 150. The inductive element 130 is (only) on the readout plane 302 and is connected to the top capacitor pad 304. As can be seen in FIGS. 20 and 21, the inductive element 130 is not limited to a spiral coil 332 around the capacitor but can be other shapes and/or designs and in other locations, according to embodiments of the invention. The qubit plane 202 (circuit plane) and readout plane 302 (circuit plane) are (circuits) formed on opposite sides of the wafer 502.

In addition to the readout resonator 106, (unlike FIG. 19) FIG. 21 shows a through-silicon via 1310 connecting the qubit plane 202 and readout plane 302. One or more through-silicon vias 1310 can be utilized to connect, for example, ground planes on the qubit plane 202 to the readout plane 302 and/or to connect other circuit elements between the qubit and readout planes as needed. Details of the through-silicon vias 1310, top via pad 1314, and bottom via pad 1304 have been discussed herein.

In FIGS. 18-21, the center piece 1802 is shown connected to a connector 1820 which can then be connected to other circuit elements, while the other end of the spiral inductor 130 is shown connected to the capacitor pad 304. These connections could be reversed. For example, the connector 1820 could be connected to the top capacitor pad 304 while the other end of the spiral inductor 130 can then be connected to other circuit elements.

Figure 22:
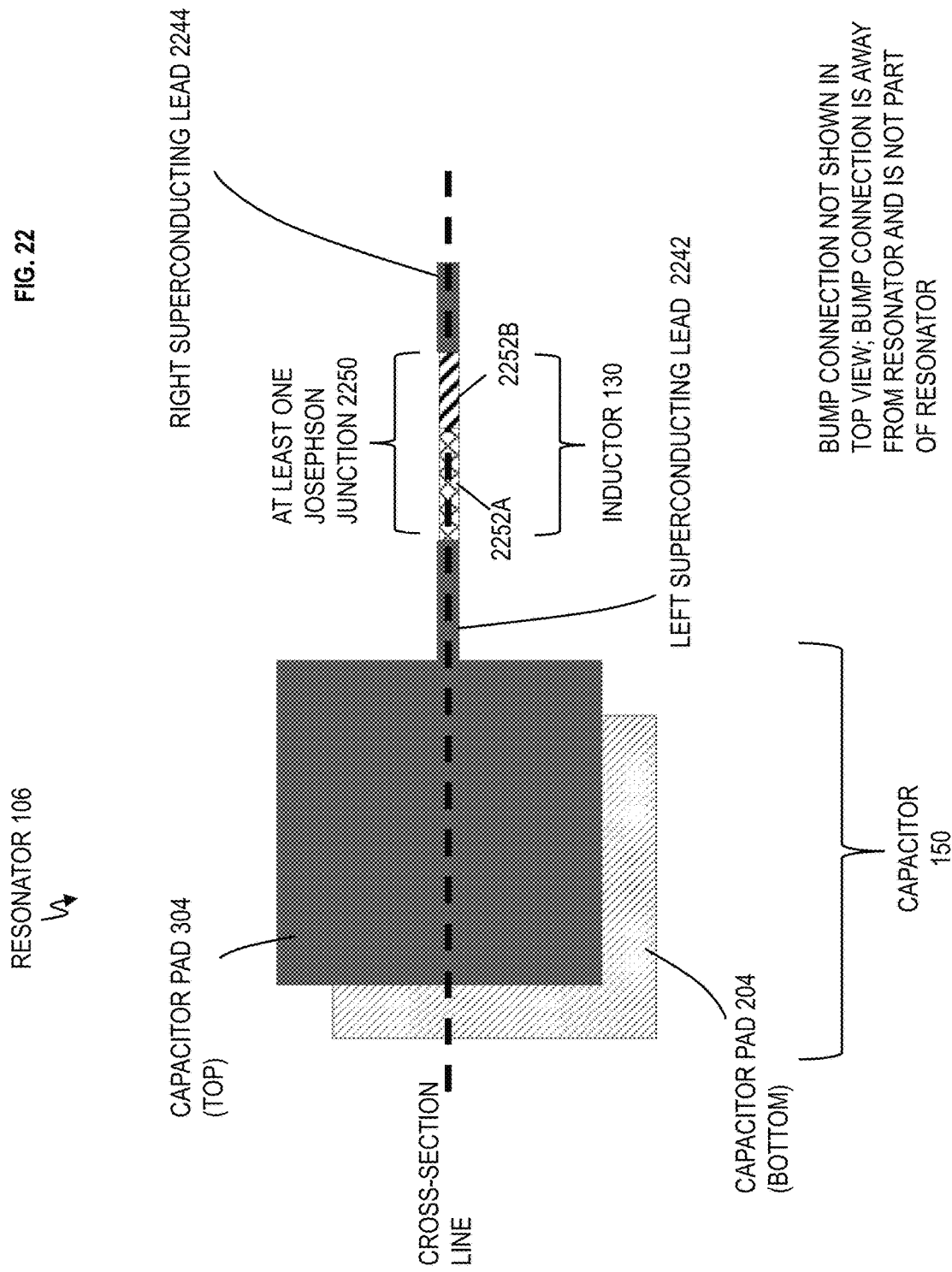
FIG. 22 depicts a simplified version of a top view for an example resonator according to embodiments of the invention.

FIG. 22 depicts a simplified version of a top view for an example resonator according to embodiments of the invention. The resonator can be, for example, a readout resonator 106. In FIG. 22, the readout resonator 106 has a top capacitor pad 304 and a bottom capacitor pad 204, which form the capacitor 150. The top capacitor pad 304 is connected to the inductive element 130. The inductive element 130 is depicted as a Josephson junction or an array of Josephson junctions 2250. The Josephson junction or array of Josephson junctions 2250 include a first superconducting electrode 2252A and a second superconducting electrode 2252B separated by a tunnel barrier 2302 (depicted in FIG. 23). The first superconducting electrode 2252A is connected to the top capacitor pad 304 by a left superconducting lead 2242. A right superconducting lead 2244 is connected to the second superconducting electrode 2252B, and the right superconducting lead 2244 connects to other circuit elements, such as, for example, a qubit, the external environment (e.g., the system 190, 192), etc. Each Josephson junction in the array has its own first and second superconducting elements 2252A and 2252B along with its tunnel barrier 2302. Josephson junction can be connected together in series.

Figure 23:
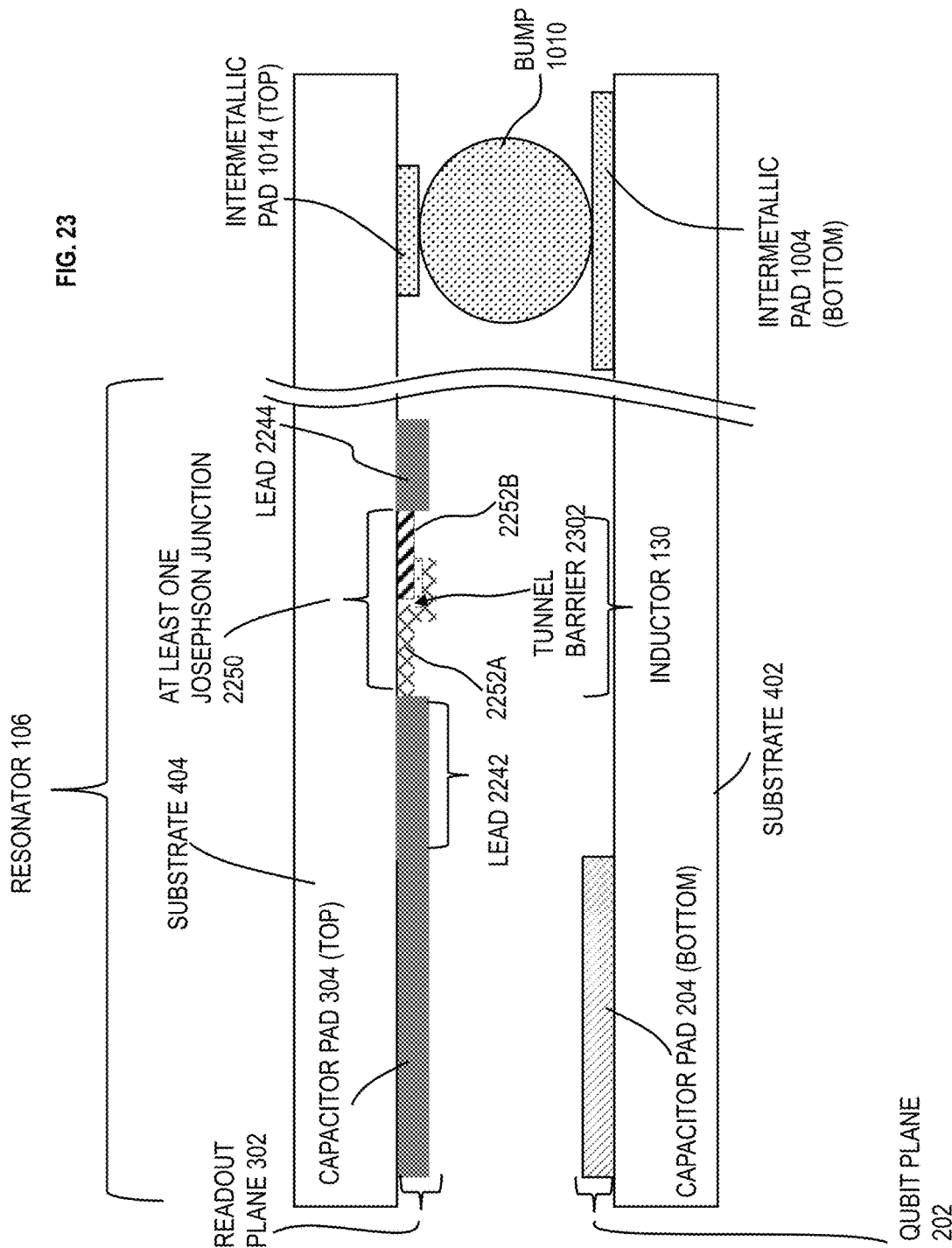
FIG. 23 depicts a cross-sectional view of the resonator in FIG. 22 according to embodiments of the invention.

FIG. 23 is a cross-sectional view of the resonator in FIG. 22 according to embodiments of the invention. FIG. 23 only illustrates an example portion of a superconducting qubit circuit 100 and it is understood that other circuit elements are present. As can be seen, the Josephson junction or array of Josephson junction 2250 are schematically depicted as two overlapping superconducting films 2252A and 2252B with the tunnel barrier 2302 in between. The tunnel barrier 2302 can be selected from the group including dielectric material, a short section of normal (non-superconducting) metal (that does not become superconducting at the cryogenic temperate of the superconducting material), and/or a constriction of a superconductor (i.e., (narrowed superconducting material) as understood by one skilled in the art.

The superconducting materials utilized as connections (right superconducting lead 2244 and left superconducting lead 2242) can be different from the superconducting material used for the capacitor 150 (the top capacitor pad 304 and the bottom capacitor 204) in some implementations and can be the same as the superconducting material used for the capacitor 150 in some implementations. The same applies for the superconducting materials utilized in the at least one Josephson junction or the array of Josephson junction 2250 (i.e., inductor 130). The superconducting material utilized for the first superconducting electrode 2252A and second superconducting electrode 2252B can be the same or different from the superconducting material used for the capacitors 150, and/or the superconducting material used for the left and right superconducting leads 2242 and 2244.

FIG. 23 shows the bottom capacitor pad 204 on the qubit plane 202 (and the qubit is not shown) and the top capacitor pad 304 on the readout plane 302, thereby forming the capacitor 150. The inductive element 130 is (only) on the readout plane 302 and is connected to the top capacitor pad 304. As can be seen in FIGS. 22 and 23, the inductive element 130 is not limited to a spiral coil 332 around the capacitor but another device (i.e., one or more Josephson junctions 2250) according to embodiments of the invention. The qubit plane 202 (circuit plane) and the bottom substrate 402 together form a bottom chip, and the readout plane 302 (circuit plane) and the top substrate 404 together form a top chip.

In addition to the readout resonator 106, the solder bump 1110 is shown connecting the qubit plane 202 and readout plane 302. One or more solder bumps 1110 can be utilized to connect, for example, ground planes on the qubit plane 202 to the readout plane 302 and/or to connect other circuit elements between the qubit and readout planes as needed. Details of the solder bump 1110, top intermetallic pad 1114, and bottom intermetallic pad 1104 are discussed herein.

Figure 24:
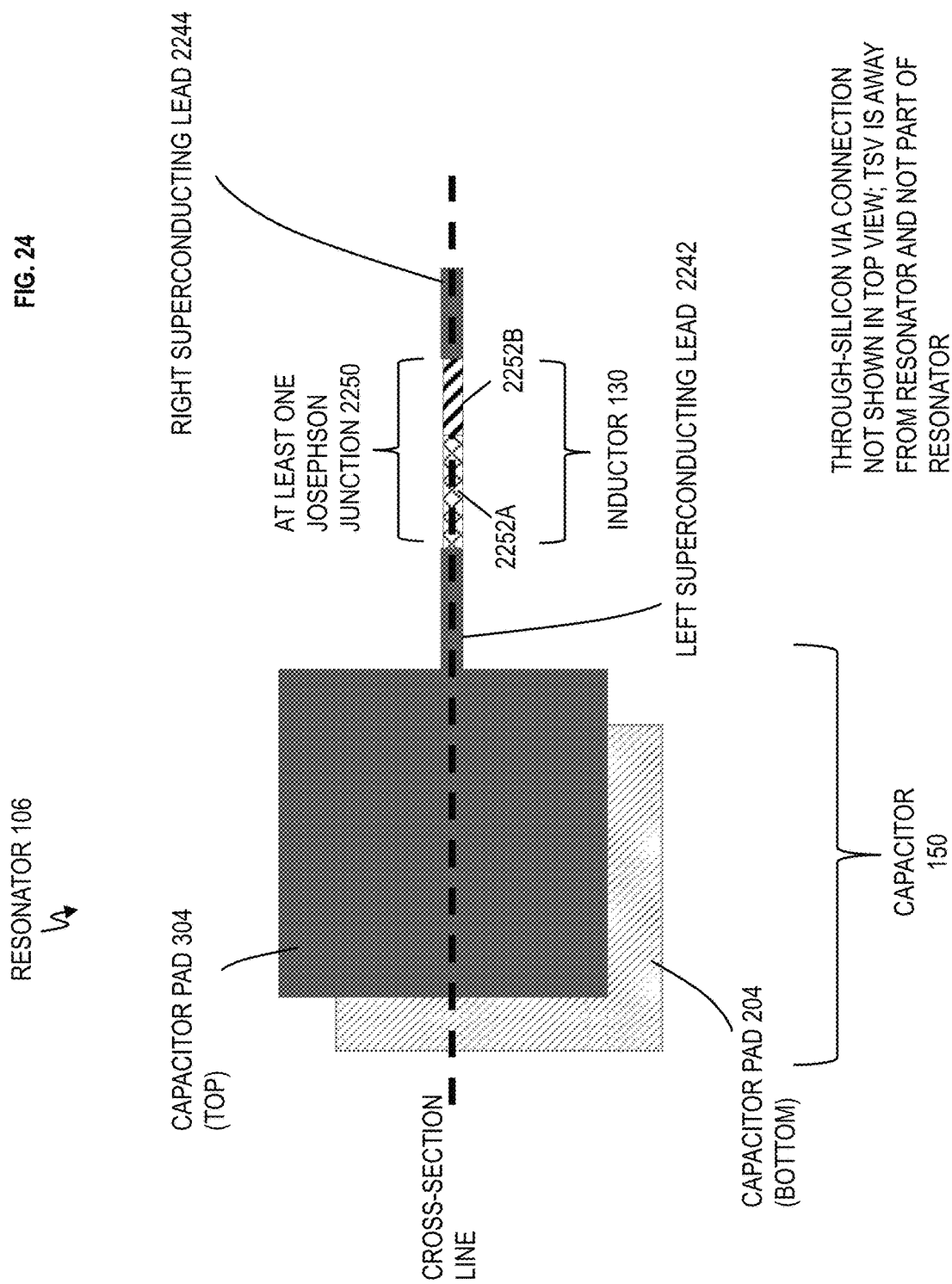
FIG. 24 depicts a simplified version of a top view for an example resonator according to embodiments of the invention.

FIG. 24 depicts a simplified version of a top view for an example resonator according to embodiments of the invention. The resonator can be, for example, a readout resonator 106. In FIG. 24, the readout resonator 106 has a top capacitor pad 304 and a bottom capacitor pad 204, which form the capacitor 150. The top capacitor pad 304 is connected to the inductive element 130. As discussed above, the inductive element 130 is depicted as a Josephson junction or an array of Josephson junctions 2250. The Josephson junction or array of Josephson junctions 2250 include a first superconducting electrode 2252A and a second superconducting electrode 2252B separated by a tunnel barrier 2302 (depicted in FIG. 25). The first superconducting electrode 2252A is connected to the top capacitor pad 304 by a left superconducting lead 2242. A right superconducting lead 2244 is connected to the second superconducting electrode 2252B, and the right superconducting lead 2244 connects to other circuit elements, such as, for example, a qubit, the external environment (e.g., the system 190, 192), etc.

Figure 25:
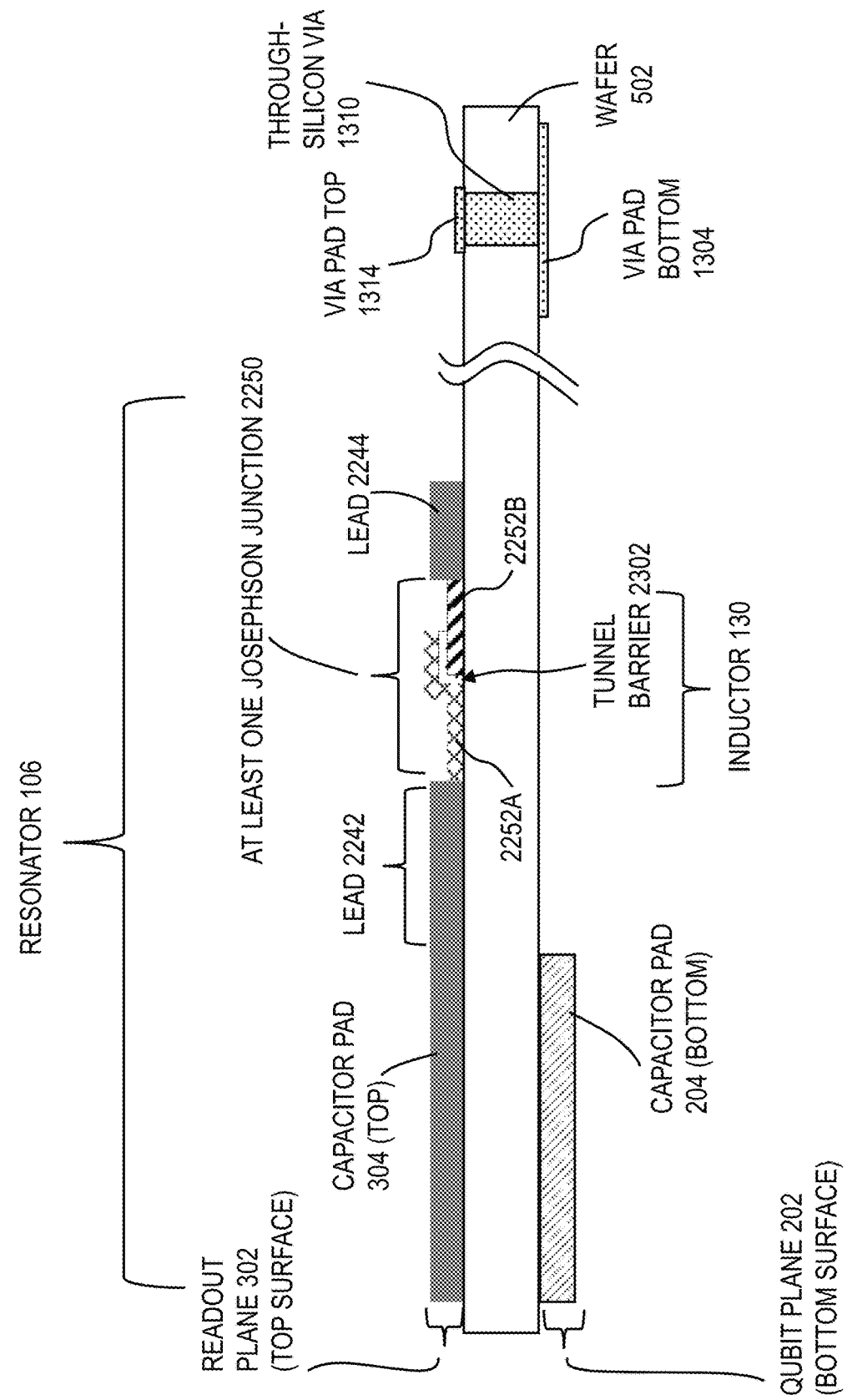
FIG. 25 is a cross-sectional view of the resonator in FIG. 22 according to embodiments of the invention.

FIG. 25 is a cross-sectional view of the resonator in FIG. 22 according to embodiments of the invention. FIG. 25 only illustrates an example portion of a superconducting qubit circuit 100 and it is understood that other circuit elements are present. As can be seen, the Josephson junction or array of Josephson junction 2250 are schematically depicted as two overlapping superconducting films 2252A and 2252B with the tunnel barrier 2302 in between. The tunnel barrier 2302 can be selected from the group including dielectric material, a short section of normal (non-superconducting) metal (that does not become superconducting), and/or a constriction of a superconductor as understood by one skilled in the art.

As noted above, the superconducting materials utilized as connections (right superconducting lead 2244 and left superconducting lead 2242) can be different from the superconducting material used for the capacitor 150 (the top capacitor pad 304 and the bottom capacitor 204) in some implementations and can be the same as the superconducting material used for the capacitor 150 in some implementations. The same applies for the superconducting materials utilized in the at least one Josephson junction or the array of Josephson junction 2250 (i.e., inductor 130). The superconducting material utilized for the first superconducting electrode 2252A and second superconducting electrode 2252B can be the same or different from the superconducting material used for the capacitors 150, and/or the superconducting material used for the left and right superconducting leads 2242 and 2244.

FIG. 25 shows the bottom capacitor pad 204 on the qubit plane 202 (and the qubit is not shown) and the top capacitor pad 304 on the readout plane 302, thereby forming the capacitor 150. The inductive element 130 is (only) on the readout plane 302 and is connected to the top capacitor pad 304. As can be seen in FIGS. 24 and 25, the inductive element 130 is not limited to a spiral coil 332 around the capacitor but another device (i.e., one or more Josephson junctions 2250) according to embodiments of the invention. The qubit plane 202 (circuit plane) and readout plane 302 (circuit plane) are (circuits) formed on opposite sides of the wafer 502.

In addition to the readout resonator 106, (unlike FIG. 23) FIG. 25 shows a through-silicon via 1310 connecting the qubit plane 202 and readout plane 302. One or more through-silicon vias 1310 can be utilized to connect, for example, ground planes on the qubit plane 202 to the readout plane 302 and/or to connect other circuit elements between the qubit and readout planes as needed. Details of the through-silicon vias 1310, top via pad 1314, and bottom via pad 1304 have been discussed herein.

Figure 26:
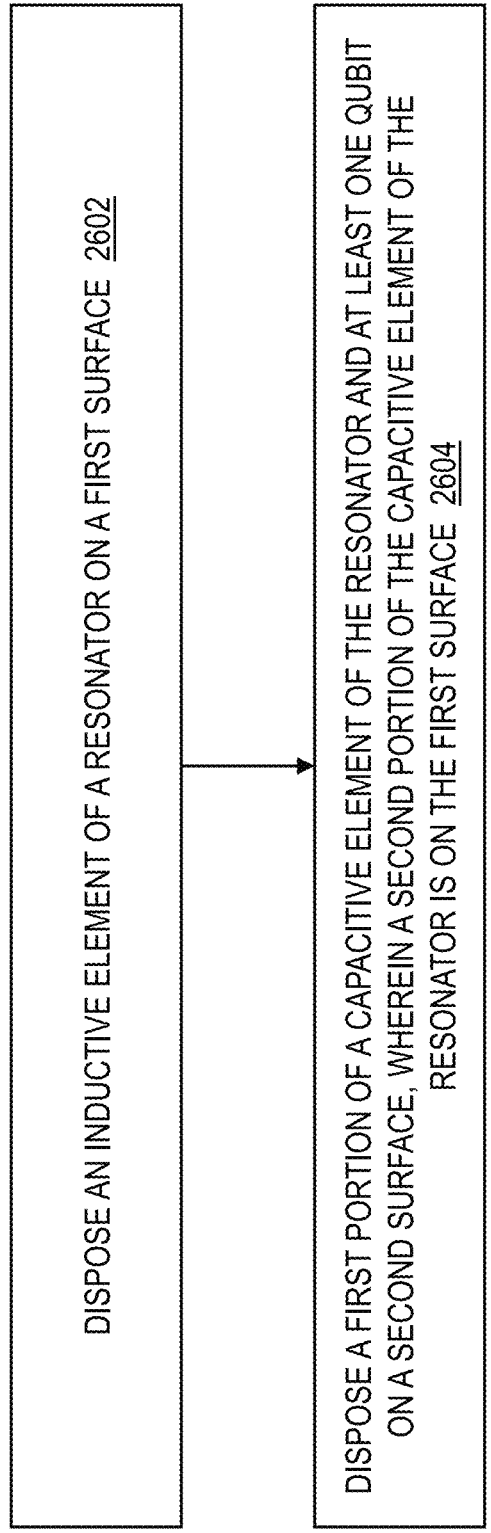
FIG. 26 depicts a flow chart of a method of forming a structure according to embodiments of the invention.

FIG. 26 depicts a flow chart 2600 of a method of forming a structure (e.g., a superconducting qubit circuit 100 having the inductive element on a separate plane) according to embodiments of the invention. At block 2602, a first surface (e.g., readout plane 302) includes an inductive element 130 of a resonator (e.g., readout resonator 106). At block 2604, a second surface (e.g., qubit plane 202) includes a first portion (e.g., capacitor pad 204) of a capacitive element 150 of the resonator (e.g., readout resonator 106) and at least one qubit (e.g., one or more qubits 102), where a second portion (e.g., capacitor pad 304) of the capacitive element 150 of the resonator is on the first surface.

The capacitive element comprises an interconnect structure 210. The interconnect structure 210 is a solder bump, e.g., as depicted in FIG. 4. The interconnect structure 210 is a through-silicon via, e.g., as depicted in FIG. 5.

The first surface and the second surface are circuit planes, and the circuit planes are on opposite sides of a substrate (e.g., substrate 502). The first surface and the second surface are circuit planes, and the circuit planes are on different substrates (e.g., substrates 402 and 404).

The interconnect structure 210 connecting the first and second portions (e.g., capacitor pads 304 and 204) forms an equipotential between at least a segment of the interconnect structure, at least a segment of the first portion, and at least a segment of the second portion.

Figure 27:
FIG. 27 depicts a flow chart of a method of forming a structure according to embodiments of the invention.

The at least one qubit is a capacitive-type quantum bit. The at least one qubit comprises an inductive-type quantum bit FIG. 27 depicts a flow chart 2700 of a method of forming a structure (e.g., a superconducting qubit circuit 100 having the inductive element on a separate plane) according to embodiments of the invention.

At block 2702, a first surface (e.g., readout plane 302) includes inductive elements 130 of resonators (e.g., numerous readout resonators 106) and first portions (e.g., numerous capacitor pads 304) of capacitive elements 150 of the resonators. At block 2704, a second surface (e.g., qubit plane 202) includes at least two qubits 102 coupled by a bus resonator (e.g., bus resonator 104), where the second surface includes second portions (e.g., numerous capacitor pads 204) of the capacitive elements 150 of the resonators. Each of the resonators (e.g., readout resonators 106) has its own capacitor pads 204 and 304 (and optionally interconnect 210) and inductive element 130.

The first surface is a first circuit plane (e.g., readout plane 302) and the second surface is a second circuit plane (e.g., qubit plane 202) separate from the first circuit plane, such that the inductive elements 130 of the resonators 106 and the at least two qubits 102 are positioned on different circuit planes.

The resonators are readout resonators 106. The readout resonators 106 are operable to read out respective ones of the at least two qubits 102. Respective ones of the readout resonators 106 are coupled (e.g., capacitively and/or inductively coupled) to respective ones of the at least two qubits 102. For example, 5, 10, 15 . . . 35 or more qubits 102 can be coupled to its own readout resonator 106 on a one-to-one basis, such that the state of the respective qubit can be read out by its respective readout resonator as understood by one skilled in the art. Each qubit 102 can have its own distinct resonance frequency for addressing, and each readout resonator 106 can have its own distinct resonance frequency for read out.

FIG. 28 depicts a flow chart of forming a superconducting qubit circuit 100 according to embodiments of the invention. At block 2802, readout resonators 106 are configured to respectively couple to qubits 102. At block 2804, one or more bus resonators 104 are configured to couple at least two of the qubits 102 together. Although one bus resonator 104 is illustrated coupling two qubits 102 in FIG. 1, it should be appreciated that the bus resonator 104 can couple 3, 4, 5, 7 . . . 10 or more qubits 102 together. At block 2806, a first surface (e.g., readout plane 302) includes inductive elements 130 of the readout resonators 106. At block 2808, a second surface (e.g., qubit plane 202) include the qubits 102, where the first and second surfaces are different circuit planes.

Although the novel structures for resonators have been explained as readout resonators, it should be appreciated that the resonators are not limited to readout resonators. Other resonators including bus resonators or even qubits can be formed as discussed so as to isolate inductive element on, for example, on the readout plane that connects to the external environment (e.g., the 50 ohm environment).

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to superconducting device and integrated circuit (IC) fabrication may or may not be described in detail herein. By way of background, however, a more general description of the superconducting device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a superconducting over a dielectric (e.g., silicon) substrate, some of which are described in the immediately following paragraphs.

In general, the various processes used to form a microchip that will be packaged into an IC fall into general categories, including, film deposition, removal/etching, and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Films of both conductors (e.g., poly-silicon, aluminum, copper, etc.) and insulators (e.g., various forms of silicon dioxide, silicon nitride, etc.) are used to connect and isolate components. Lithography is the formation of three-dimensional relief images or patterns on the semiconductor substrate for subsequent transfer of the pattern to the substrate. In lithography, the patterns are formed by a light sensitive polymer called a photo-resist. To build the complex structures of a circuit, lithography and etch pattern transfer steps are repeated multiple times. Each pattern being printed on the wafer is aligned to the previously formed patterns and slowly the conductors, insulators and other regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A structure comprising:
   a first surface comprising an inductive element of a resonator; and
   a second surface comprising a first portion of a capacitive element of the resonator and at least one qubit, wherein a second portion of the capacitive element of the resonator is on the first surface;
   wherein an interconnect structure connecting the first and second portions forms an equipotential between the interconnect structure, the first portion, and the second portion.

2. The structure of claim 1, wherein the capacitive element comprises the interconnect structure.

3. The structure of claim 2, wherein the interconnect structure comprises a solder bump.

4. The structure of claim 2, wherein the interconnect structure comprises a through-silicon via.

5. The structure of claim 1, wherein the first surface and the second surface comprise circuit planes, the circuit planes being on opposite sides of a substrate.

6. The structure of claim 1, wherein the first surface and the second surface comprise circuit planes, the circuit planes being on different substrates.

7. The structure of claim 1, wherein the at least one qubit comprises a capacitive-type quantum bit.

8. The structure of claim 1, wherein the at least one qubit comprises an inductive-type quantum bit.

9. A method of forming a structure, the method comprising:
   disposing an inductive element of a resonator on a first surface; and
   disposing a first portion of a capacitive element of the resonator and at least one qubit on a second surface, wherein a second portion of the capacitive element of the resonator is on the first surface;
   wherein an interconnect structure connecting the first and second portions forms an equipotential between the interconnect structure, the first portion, and the second portion.

10. The method of claim 9, wherein the capacitive element comprises the interconnect structure.

11. The method of claim 10, wherein the interconnect structure comprises a solder bump.

12. The method of claim 10, wherein the interconnect structure comprises a through-silicon via.

13. The method of claim 9, wherein the first surface and the second surface comprise circuit planes, the circuit planes being on opposite sides of a substrate.

14. The method of claim 9, wherein the first surface and the second surface comprise circuit planes, the circuit planes being on different substrates.

15. The method of claim 9, wherein the at least one qubit comprises a capacitive-type quantum bit.

16. The method of claim 9, wherein the at least one qubit comprises an inductive-type quantum bit.

17. A structure comprising:
   a first surface comprising inductive elements of resonators and first portions of capacitive elements of the resonators; and
   a second surface comprising at least two qubits coupled by a bus resonator, the second surface comprising second portions of the capacitive elements of the resonators, the first surface and the second surface being separated by a substrate.

18. The structure of claim 17, wherein the first surface comprises a first circuit plane and the second surface comprises a second circuit plane separate from the first circuit plane, such that the inductive elements of the resonators and the at least two qubits are positioned on different circuit planes.

19. The structure of claim 17, wherein the resonators comprise readout resonators.

20. The structure of claim 19, wherein the readout resonators are operable to read out respective ones of the at least two qubits.

21. The structure of claim 19, wherein respective ones of the readout resonators are coupled to respective ones of the at least two qubits.

22. A method of forming a structure, the method comprising:

disposing inductive elements of resonators and first portions of capacitive elements of the resonators on a first surface; and disposing at least two qubits coupled by a bus resonator on a second surface, the second surface comprising second portions of the capacitive elements of the resonators;

wherein the capacitive elements respectively comprise an interconnect structure coupling the first and second surfaces, the interconnect structure being selected from the group consisting of a solder bump and a through-silicon via.

23. A superconducting qubit circuit comprising:

readout resonators configured to respectively couple to qubits;

one or more bus resonators configured to couple at least two of the qubits together;

a first surface comprising inductive elements of the readout resonators and first portions of capacitive elements of the readout resonators; and a second surface comprising the qubits and second portions of the capacitive elements of the readout resonators, the first and second surfaces being different circuit planes;

wherein the capacitive elements respectively comprise an interconnect structure coupling the first and second surfaces, the interconnect structure being selected from the group consisting of a solder bump and a through-silicon via.

* * * * *